United States Patent [19]

Koenck

[11] Patent Number: 4,553,081
[45] Date of Patent: Nov. 12, 1985

[54] PORTABLE BATTERY POWERED SYSTEM

[75] Inventor: Steven E. Koenck, Cedar Rapids, Iowa

[73] Assignee: Norand Corporation, Cedar Rapids, Iowa

[21] Appl. No.: 612,588

[22] Filed: May 21, 1984

Related U.S. Application Data

[63] Continuation-in-part of Ser. No. 385,830, Jun. 7, 1982, Pat. No. 4,455,523.

[51] Int. Cl.$^4$ ............................................. H02J 7/00
[52] U.S. Cl. ...................................... 320/43; 320/35; 320/39; 320/48; 340/636
[58] Field of Search ................... 320/2, 35, 39, 43, 48; 340/636

[56] References Cited

U.S. PATENT DOCUMENTS 4,203,103  5/1980  Osada et al. ...................... 340/636
4,308,492  12/1981  Mori et al. ........................... 320/35
4,455,523  6/1984  Koenck ................................ 320/43

Primary Examiner—Peter S. Wong
Assistant Examiner—Anita M. Ault
Attorney, Agent, or Firm—Hill, Van Santen, Steadman & Simpson

[57] ABSTRACT

In a exemplary embodiment, a battery conditioning system monitors battery conditioning and includes a memory for storing data based thereon; for example, data may be stored representative of available battery capacity as measured during a deep discharge cycle. With a microprocessor monitoring battery operation of a portable unit, a measure of remaining battery capacity can be calculated and displayed. Where the microprocessor is permanently secured to the battery so as to receive operating power therefrom during storage and handling, the performance of a given battery in actual use can be accurately judged since the battery system can itself maintain a count of accumulated hours of use and other relevant parameters.

30 Claims, 15 Drawing Figures

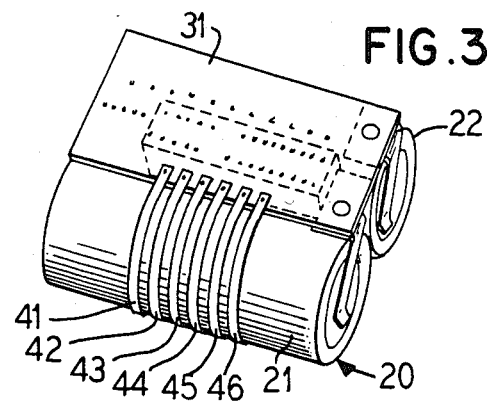
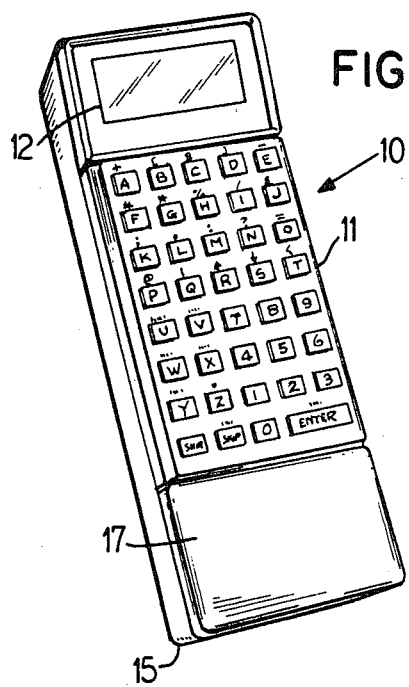
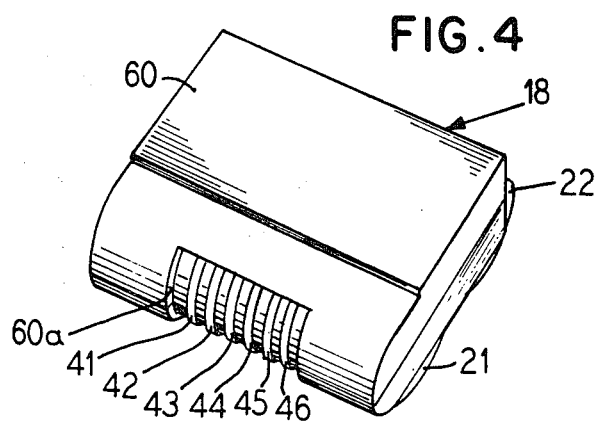
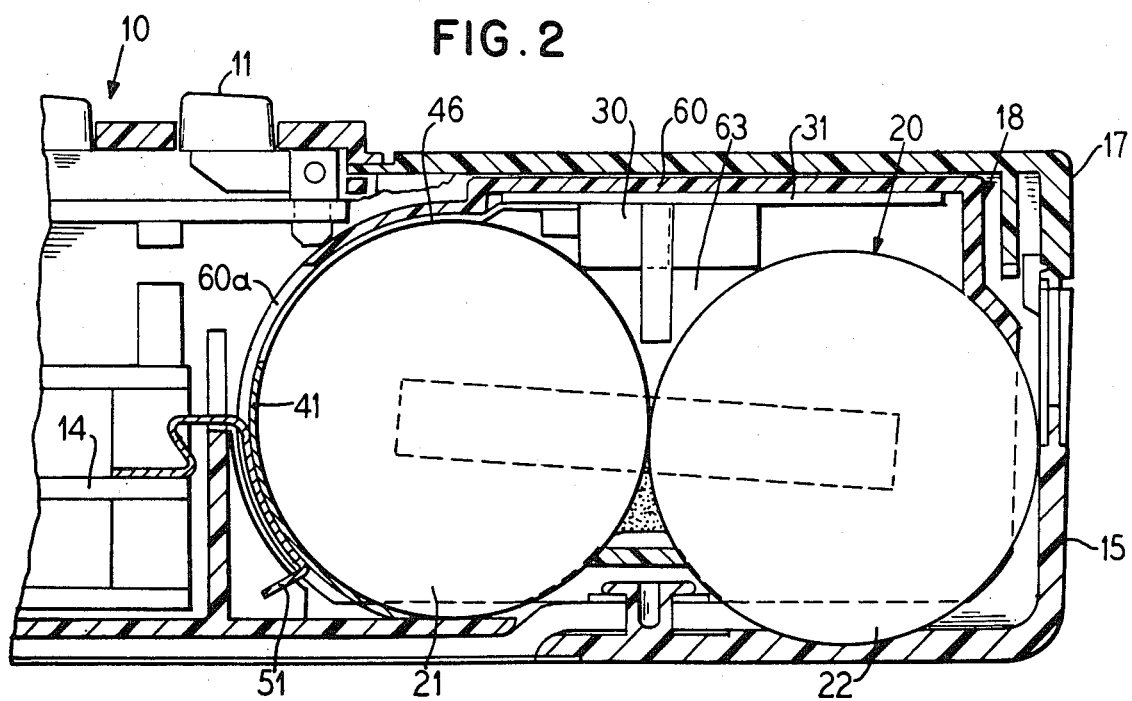

PORTABLE BATTERY POWERED SYSTEM

CROSS-REFERENCE TO RELATED APPLICATION

The present application is a continuation in part of my prior application U.S. Ser. No. 385,830 filed June 7, 1982, now U.S. Pat. No. 4,455,523 and the disclosure and drawings of this prior application are incorporated herein by reference in their entirety.

BACKGROUND OF THE INVENTION

The present invention relates to portable battery powered systems and particularly to a battery system for portable devices capable of optimizing the performance of a rechargeable electrochemical storage medium while at the same time maximizing its useful life.

Portable computerized systems are presently being extensively utilized in a wide range of applications. For example, such systems may be utilized in delivery vehicles which are to be away from a central warehouse or the like for a major part of each working day. Recharging operations may take place in locations subject to extremes of temperature. It is particularly crucial to avoid an equipment failure where a portable device is a vital link to the completion of scheduled tasks at remote locations and the like. In such circumstances a loss of adequate battery power can be just as detrimental as any other malfunction.

SUMMARY OF THE INVENTION

It is a basic objective of the present invention to provide a portable battery powered system of increased reliability and useful life.

An important feature of the invention resides in the provision of a portable system wherein the user can obtain a relatively accurate indication of the battery energy remaining available for use at any time during a portable operating cycle. Further, the user can be automatically alerted when battery capacity diminishes to a selected value, or when battery output voltage is at a selected marginal level.

For the sake of recharging of a battery system as rapidly as possible without detriment to an optimum useful life span, battery parameters including battery temperature can be monitored during a charging cycle and the battery charging current can be adjusted accordingly.

Since a battery may deteriorate when subjected to repeated shallow discharge and recharging cycles, according to the present invention, a count of such shallow charge cycles may be automatically maintained throughout the operating life of the battery system, such that deep discharge cycles may be effected as necessary to maintain desired performance standards.

Furthermore, according to another highly significant feature of the invention, automatically operating battery monitoring and/or conditioning circuitry may be secured with the battery pack for handling as a unit therewith. The monitoring circuitry may receive its operating power from the battery pack during storage or handling such that a total history of the battery pack may be retained for example in a volatile memory circuit where such type of memory otherwise provides optimum characteristics for a portable system. The conditioning circuitry may have means for effecting a deep discharge cycle, and concomitantly with the deep discharge cycle, a measure of actual battery capacity may be obtained. From such measured battery capacity and a continuous measurement of battery current during portable operation, a relatively accurate "fuel gauge" function becomes feasible such that the risk of battery failure during field operation can be essentially eliminated. The performance of a given type of battery in actual use can be accurately judged since the battery system can itself maintain a count of accumulated hours of use, and other relevant parameters.

In a simplified system currently in use, the conditioning system is incorporated in the portable utilization device such that the programmed processor of the utilization device may itself automatically effect a deep discharge conditioning cycle and/or a deep discharge capacity test. The deep discharge cycle may be effected at a controlled rate, such that the time for discharge from a fully charged condition to a selected discharge condition may itself represent a measure of battery capacity. Instead of directly measuring battery current during use, the programmed processor may maintain a measure of operating time and/or elapsed time during portable operation, so as to provide an indication of remaining battery capacity.

The invention will now be described, by way of example and not by way of limitation, with reference to the accompanying sheets of drawings; and other objects, features and advantages of the invention will be apparent from this detailed disclosure and from the appended claims.

BRIEF DESCRIPTION OF THE DRAWINGS

FIG. 1 is a somewhat diagrammatic perspective view of a portable battery powered device which may incorporate a battery system in accordance with the teachings and principles of the present invention;

FIG. 2 is a somewhat diagrammatic enlarged longitudinal sectional view showing the battery compartment section and adjacent portions of the portable device of FIG. 1, with a battery pack assembly disposed in the battery compartment in operative coupling relationship with a central processing unit of the portable device for purposes of power supply to the central processing unit and for purposes of transmission of data and command signals;

FIG. 3 is a somewhat diagrammatic perspective view of a battery system in accordance with the teachings and principles of the present invention;

FIG. 4 is a perspective view similar to FIG. 3 but illustrating the battery system enclosed in a protective casing, to form a complete battery pack assembly for insertion into the battery compartment of the portable device, as a unit;

DETAILED DESCRIPTION

Figure 5:
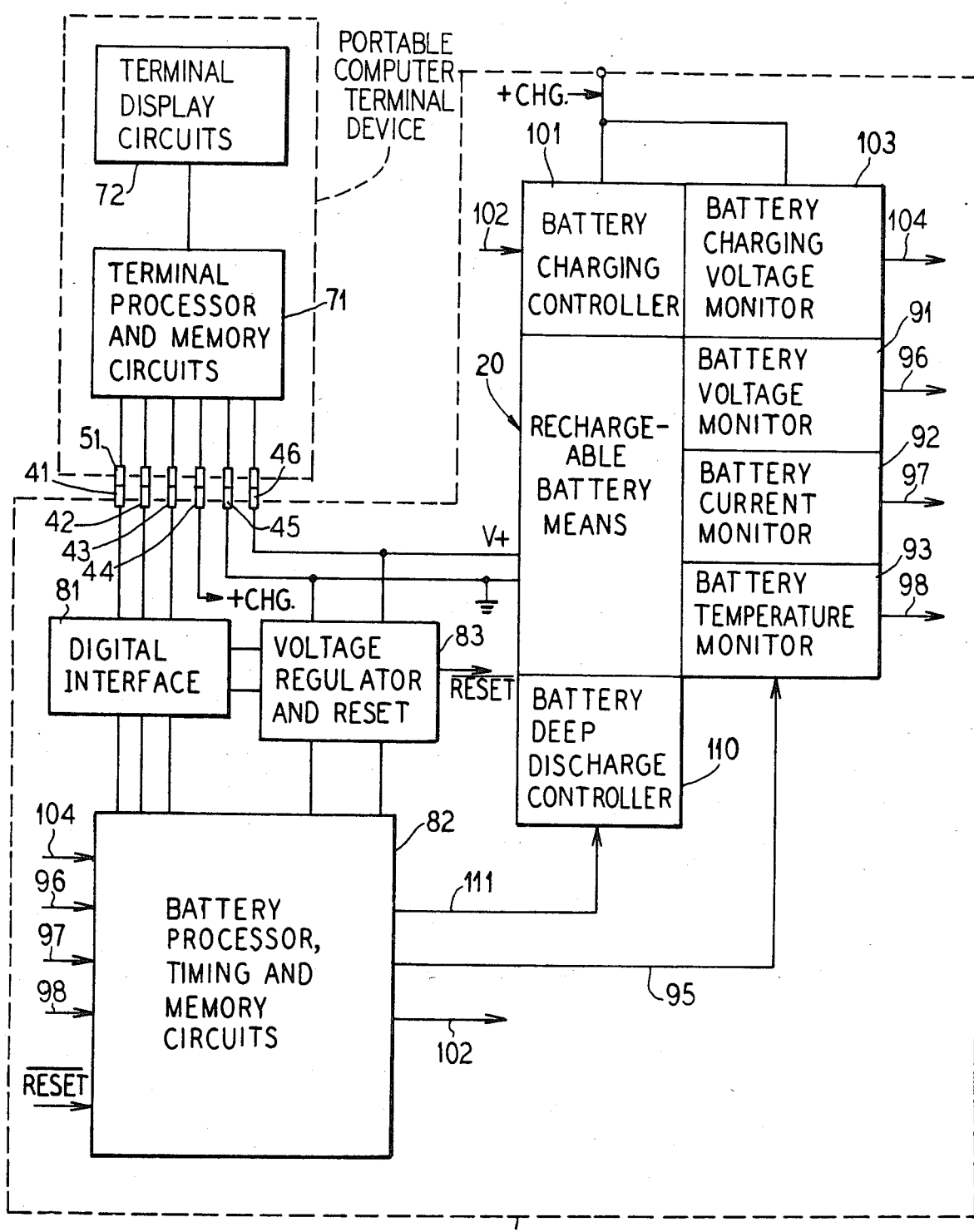
FIG. 5 shows a block diagram for explaining the cooperative relationship of the electronic parts of the particular portable computer terminal device and battery system shown in FIGS. 1 through 4, by way of example and not by way of limitation.

FIG. 1 is a perspective view of a portable battery powered device to which the present invention may be applied. The device is generally indicated by reference numeral 10 and is of a size to be conveniently held in one hand while a keyboard generally indicated at 11 is manually actuated by means of one or more fingers of the other hand. Characters entered by means of the keyboard 11 are displayed on a panel 12 under the control of a microprocessor located generally as indicated at 14 in FIG. 2. At an end 15 of the portable device a battery receiving means or compartment is provided. Access to the battery compartment is obtained via a removable cover element 17. By unlatching and opening the cover element 17, a battery pack assembly such as indicated at 18 in FIG. 4 may be inserted into or removed from the battery compartment.

By way of example, the battery pack assembly 18 may be comprised of rechargeable nickel-cadmium battery cells such as indicated at 21 and 22 in FIG. 2. By way of example, four nickel-cadmium cells may supply a nominal output voltage of five volts and have a rated capacity of about 2.2 ampere-hours. By way of example, the central processing unit 14 of the portable device 10 may require an operating voltage of five volts plus or minus ten percent, so that a voltage regulator would be asociated with the central processing unit so as to ensure an actual supply voltage within the range from 4.5 volts to 5.5 volts. The size and weight of the portable device together with the battery pack assembly 18 is such that the complete portable battery powered system can be held in one hand while the keyboard 11 is being operated with the fingers of the other hand.

In a typical use of the portable device 10, it is contemplated that the device may be used in an outdoor environment so as to be subject to a wide temperature range and relatively intensive daily use for example eight to ten hours per day. The battery pack assembly 18 is to be so designed as to have a maximum useful life even in such a stringent environment, thereby to ensure the maximum utility and reliability of the overall portable system as represented in FIG. 1.

For the sake of ensuring optimum reliability and usefulness of the overall system of FIG. 1, the battery pack assembly 18 includes digital processing circuitry 30 capable of data communication with the central processing unit 14 of the device 10. To this end, in the illustrated embodiment, as indicated in FIG. 3, the battery means 20 including the rechargeable battery cells carries therewith a printed circuit board 31 having flexible electrically conductive straps 41 through 46 which automatically make firm and reliable electrical contact with connector strips such as indicated at 51 of the terminal device 10. Two of the conductive straps of the set 41-46 may be connected with the opposite polarity terminals of the battery means 20 so as to supply battery voltage to the regulator means of the central processing unit 14. The remaining straps of the set 41-46 may serve to provide a communication channel between a battery processor unit of the processor circuitry 30 and the central processor unit 14 of the terminal device 10.

Referring to FIG. 4, the battery pack assembly 18 may include an insulating casing part 60 which has an aperture at 60a in FIG. 4 for exposing the conductor straps 41 through 46 for resilient pressure engagement with respective cooperating terminal connectors such as indicated at 51 in FIG. 2. As indicated in FIG. 2, the dimensions of the battery compartment of the device 10 are closely matched to the dimensions of the battery pack assembly 18 so that the battery pack assembly 18 can only be fitted within the battery compartment in such a way that the straps 41 through 46 are in firm engagement with the respective terminal connectors such as 51.

From FIGS. 2, 3 and 4, it will be understood that the processor circuitry 30 including the conductive straps 41-46 is secured with the battery means 20 for removability from the battery compartment as a unit. Thus the battery pack assembly 18 has self-contained processor circuitry as indicted at 30. As will be explained hereinafter, this processor circuitry 30 is electrically coupled with the battery means 20 so as to receive operating power therefrom both while the battery means forms part of the portable system 10 and while the battery means is separate from the portable unit. Thus, even where the processor circuitry 30 is provided with a memory requiring a constant supply of power, data is not lost from the memory upon removal of the battery means for the portable device 10. Still further as will be hereinafter explained the processor circuitry 30 including its memory may be operable with a battery voltage substantially less than that required by the central processor unit 14, so that data is not lost from the memory of the processing circuitry of the battery pack assembly even where the battery means has been discharged so as to have a relatively low output voltage below the minimum required operating voltage for the central processing unit 14. In this way, the battery memory means is enabled to retain an operating history of a particular rechargeable battery pack over the entire life of such battery pack, while on the other hand the processor circuitry 30 is designed so as to require a minimum space beyond the outline configuration of the rechargeable battery cells themselves. In FIG. 2, it will be observed that the casing 60 is relatively closely spaced to the periphery of the battery cells such as 21 and 22 is comparison to the cross sectional dimensions of such battery cells, and that the processor circuitry 30 is of a width dimension as viewed in FIG. 2 so as to at least partially fit within a nitch such as indicated at 63 between the two sets of battery cells. Still further, such processor circuitry 30 is selected so as to provide an essentially minimal power drain on the battery means 20, such that the battery means may be stored for long periods of time without loss of the data stored in the battery memory means. For example, the processor circuitry 30 including its associated memory means may require only a few percent of the current required by the processing system of the portable unit 10. For example, a shelf life of from one to two months for the battery memory means is feasible.

DESCRIPTION OF FIG. 5

FIG. 5 illustrates an overall exemplary circuit diagram for the embodiment of FIGS. 1 through 4. In FIG. 5, reference numeral 71 indicates a terminal processor component including central processing unit 14 and associated memory circuits. Component 72 in FIG. 5 represents terminal display circuits which may be associated with the display screen 12 of FIG. 1. Terminal connectors such as 51 are also diagrammatically indicated and are shown as being electrically connected with the flexible straps 41 through 46, respectively, of the battery pack assembly.

In FIG. 5, the battery pack or rechargeable battery means is again generally designated by reference numeral 20, and the positive and negative output terminals of the battery means 20 are indicated as being connected with the terminal processor and memory circuits component 71 via electrically conductive straps 45 and 46.

Reference numeral 81 in FIG. 5 designates a digital interface component which serves for the coupling of the terminal processor of component 71 with a battery processor of component 82 of the battery pack assembly 18. Simply for the sake of example, communication between the battery processor of component 82 and the terminal processor of component 71 is indicated at taking place via three conductors which include respective conductive straps 41 through 43 of the battery pack assembly 18, FIG. 4. Further details of an exemplary digital inteface circuit for implementing component 18 will be given in relation to a more detailed electric circuit diagram to be described hereinafter. For the sake of correlation with the detailed circuit to be later described, reference numeral 83 designates a voltage regulator and reset circuit. Component 83 serves to supply a regulated operating voltage to the component 82 as well as to circuits of the digital interface component 81 in a specific preferred implementation of the present invention to be described hereinafter. Component 82 in such specific example includes a memory which requires a continuous operating voltage in order to maintain a continuous history of the battery means 20. The reset circuitry of component 83 is adapted to supply a RESET signal which serves to indicate that the memory means has had its operating voltage interrupted.

Components 91, 92 and 93 in FIG. 5 represent battery monitoring means operatively coupled with the battery means 20 for the purpose of obtaining quantitative measures of respective battery parameters. Where the respective parameter sensing means of components 91, 92 and 93 supply analog signals, digital to analog converter means may be associated with the monitor circuitry for the purpose of obtaining the quantitative parameter measurements in digital form. In a particular preferred arrangement to be hereafter described in detail, the battery processor of component 82 may supply digital reference signals via the line 95, and the digital reference value may be converted into a common analog reference signal for matching with the respective analog measurement values of components 91, 92 and 93. In this particular embodiment, comparator circuits may be included in components 91, 92 and 93 for comparing the respective analog measurement signals with the common analog reference value in a predetermined order, the logical output signals from the comparator means being supplied via lines 96, 96 and 98 to the processor means for signaling when the digitally generated analog reference signal has reached a level exceeding the analog measurement value being compared therewith. The digital measurement values so determined may be utilized as a basis for updating battery condition information in the memory of component 82.

A battery charging voltage input is indicated by the symbol "+CHG". Battery charging current is supplied to the rechargeable battery means 20 via a battery charging current path which is controlled by a battery charging controller circuit 101 which may receive a digital battery charge control signal via line 102 in FIG. 5. According to a preferred embodiment to be described in detail hereafter, the battery charging current path further includes a battery current sensing means which forms part of component 92. The arrangement is preferably such that the battery current measured by component 92 during a charging operation does not include any charging current which may be supplied to the terminal device including components 71 and 72 in FIG. 5. Thus the battery processor of component 82 during a charging operation receives from component 92 a quantitative measure of actual charging current supplied to the battery means itself. A battery charging voltage monitor 103 is operatively coupled with the battery charging voltage input "+CHG" and is operative to supply a quantitative measure of battery charging voltage to the processor circuitry of component 82. For example, in a preferred arrangement, the digital reference value supplied by line 95 in FIG. 5 is utilized periodically to generate an analog reference value for comparison with the analog reading of battery charging voltage of component 103. In this case, a comparator circuit of component 103 signals via output line 104 when the analog reference value exceeds the currently occurring analog value of the battery charging voltage. Thus, during a battery charging cycle, the battery processor of component 82 is supplied with battery operating information from which an optimum battery charging current can be selected. In particular, by sensing battery temperature during the battery charging operation, it is possible to provide a battery system which is adaptable to operation under a wide range of environmental conditions while yet assuring optimum efficiency in carrying out a battery recharging operation.

For further assuring the optimum conditioning and maximum operating life of the battery system, FIG. 5 illustrates a battery deep discharge controller component 110 as being electrically connected with the battery means and being controlled by an input line 111 for effecting a deep discharge conditioning of the battery means 20 at suitable times during the operating life of the battery means. In accordance with the teachings of the present invention, during the deep discharge cycle of the battery means, battery current is continuously measured by the battery current monitoring component 92 so as to enable the battery processor and memory circuits of component 82 to derive a quantitative measure of the available capacity of the battery means. In a relatively simple determination of battery capacity, the battery means 20 may be first fully charged, and then subject to a deep discharge cycle wherein the battery means is discharged at a predetermined rate until such time as the battery means 20 exhibits a battery output voltage of a predetermined value, for example, four volts where components 71 and 72 of the terminal device require a minimum operating voltage of say 4.5 volts. By way of example if the battery means has a nominal rated capacity of 2.2 amp hours, the battery may be discharged at a rate of 220 milliamperes (battery capacity C divided by ten). In this case a deep discharge cycle would be completed within not more than about ten to twelve hours. (See FIG. 8 which represents the discharge characteristic of one nickel-cadmium cell.)

Charge current is coupled to the battery pack via conductive strap 44 of FIG. 5.

DESCRIPTION OF FIGS. 6 AND 7

Figure 6:
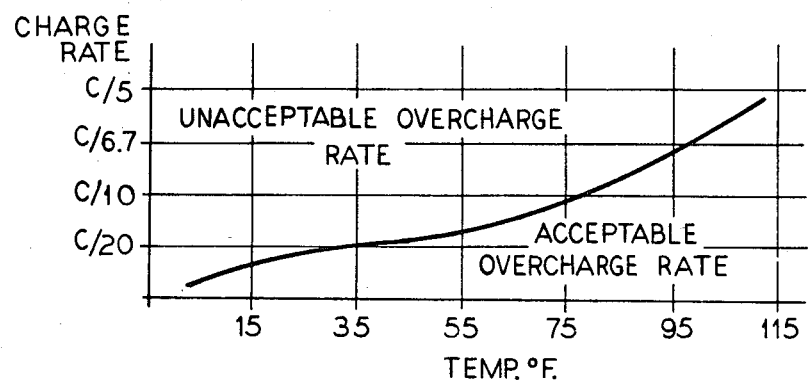
FIG. 6 shows a typical plot of permissible continuous overcharge rate as a function of temperature, for a particular type of rechargeable electrochemical energy storage cell, by way of example and not by way of limitation.

By way of background, FIG. 6 is a plot illustrating maximum charge rate as a function of temperature. It will be observed that at relatively low temperatures, the permissible charging rate is relatively low. Thus a battery system adaptable to a wide range of environmental conditions, and yet utilizing a maximum charging rate is achieved when the charging rate can be adjusted according to quantitative measurement of battery temperature during the charging cycle.

Specifically for the case of a nickel-cadmium battery pack overcharging is the point at which the majority of charge current generates oxygen at the positive electrode rather than increasing the state of charge of the cell. This point occurs at approximately the 75% state of charge level. As oxygen is generated, the internal pressure of the cell increases, which ultimately determines the amount of overcharge the cell can withstand. The maximum allowable rate is a strong function of cell temperature. This is due to the fact that the generated oxygen must re-combine with cadmium at the negative electrode to prevent oxygen build-up and hence internal pressure increase. The rate of re-combination is dictated by cell temperature due to the viscosity of the electrolyte and the rate of the chemical reaction at the negative electrode. If the allowable overcharge rate for a given cell temperature is exceeded, the cell pressure may exceed the pressure relief valve safety level, causing venting and potentially expelling electrolyte, which drastically reduces cell life.

Figure 7:
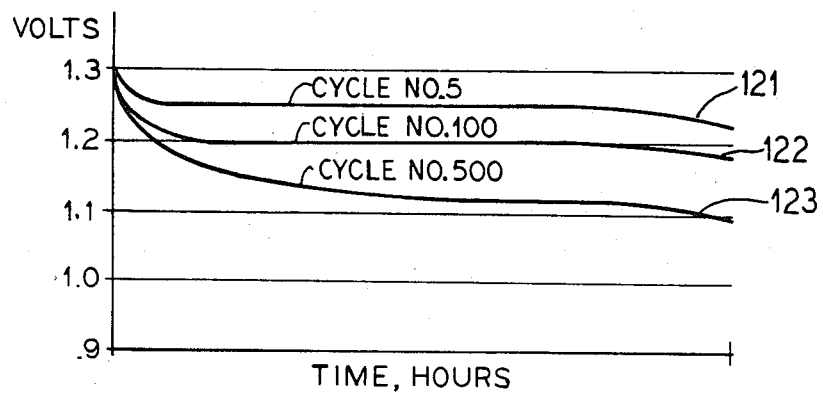
FIG. 7 is a plot of the effect of repetitive shallow cycling for the particular energy storage medium also represented by the plot of FIG. 6.

FIG. 7 illustrates the effect of repetitive shallow cycling on the output voltage of a given cell of a nickel-cadmium battery pack. Curves 121, 122 and 123 show the variation in output voltage over an operating cycle for respective increasing numbers of shallow operating cycles. Specifically curve 121 shows the variation in output voltage over time in hours for shallow discharge cycle number 5, while curve 122 represents the corresponding variation at shallow cycle number 100 and curve 123 shows the result at cycle number 500. Not only does repetitive shallow discharge produce a voltage depression effect as illustrated in FIG. 7, but this type of operation of the battery pack also causes a gradual and consistent degradation of cell capacity.

DESCRIPTION OF FIG. 8

Figure 8:
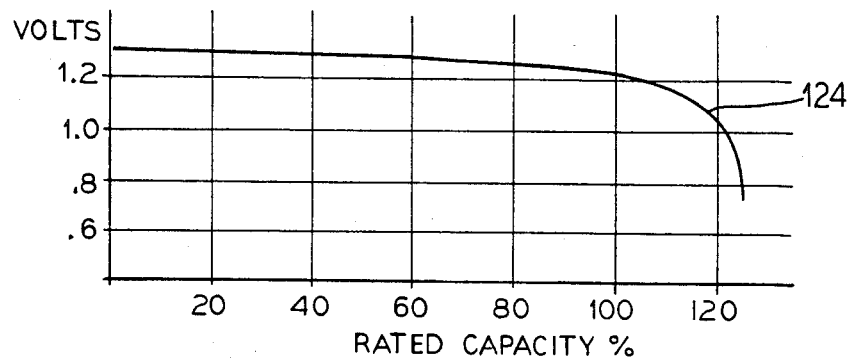
FIG. 8 is a plot of discharge characteristics for the particular energy storage medium also represented by the plots of FIGS. 6 and 7.

FIG. 8 illustrates the discharge characteristic for a nickel-cadmium cell. A deep discharge of the cell is considered to have taken place at region 124 where the output voltage begins to decrease relatively rapidly. A deep discharge cycle may be considered to have been effected when the cell voltage falls to a value of one volt, for example. A deep discharge, at a normal rate of battery usage, say battery capacity divided by twenty (C/20), might require more than twenty hours of portable operation without a recharging cycle.

DESCRIPTION OF FIGS. 9A AND 9B

Figure 9A:
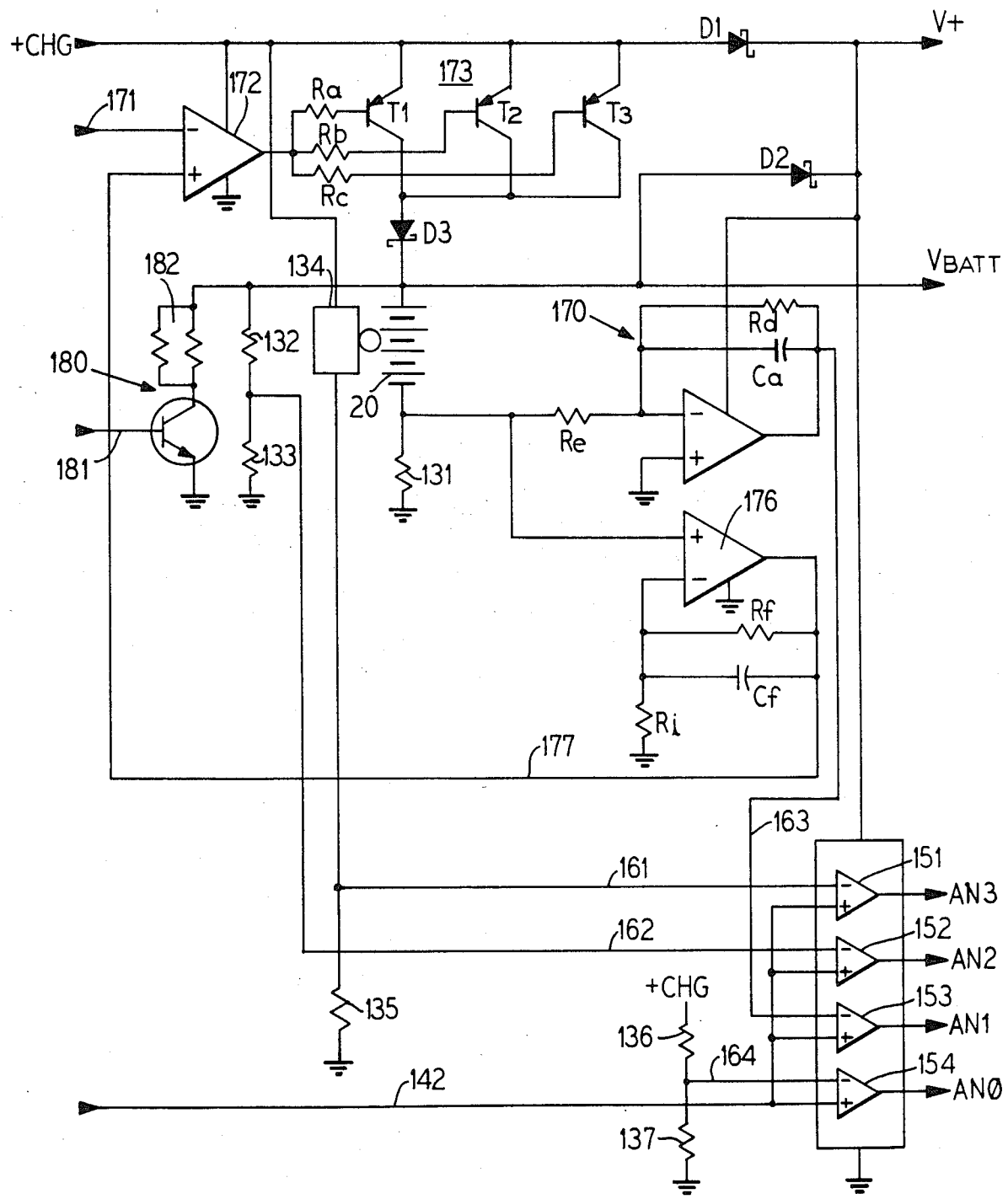
FIGS. 9A and 9B show a specific circuit implementation in accordance with the block diagram of FIG. 5, by way of example and not by way of limitation.
Figure 9B:
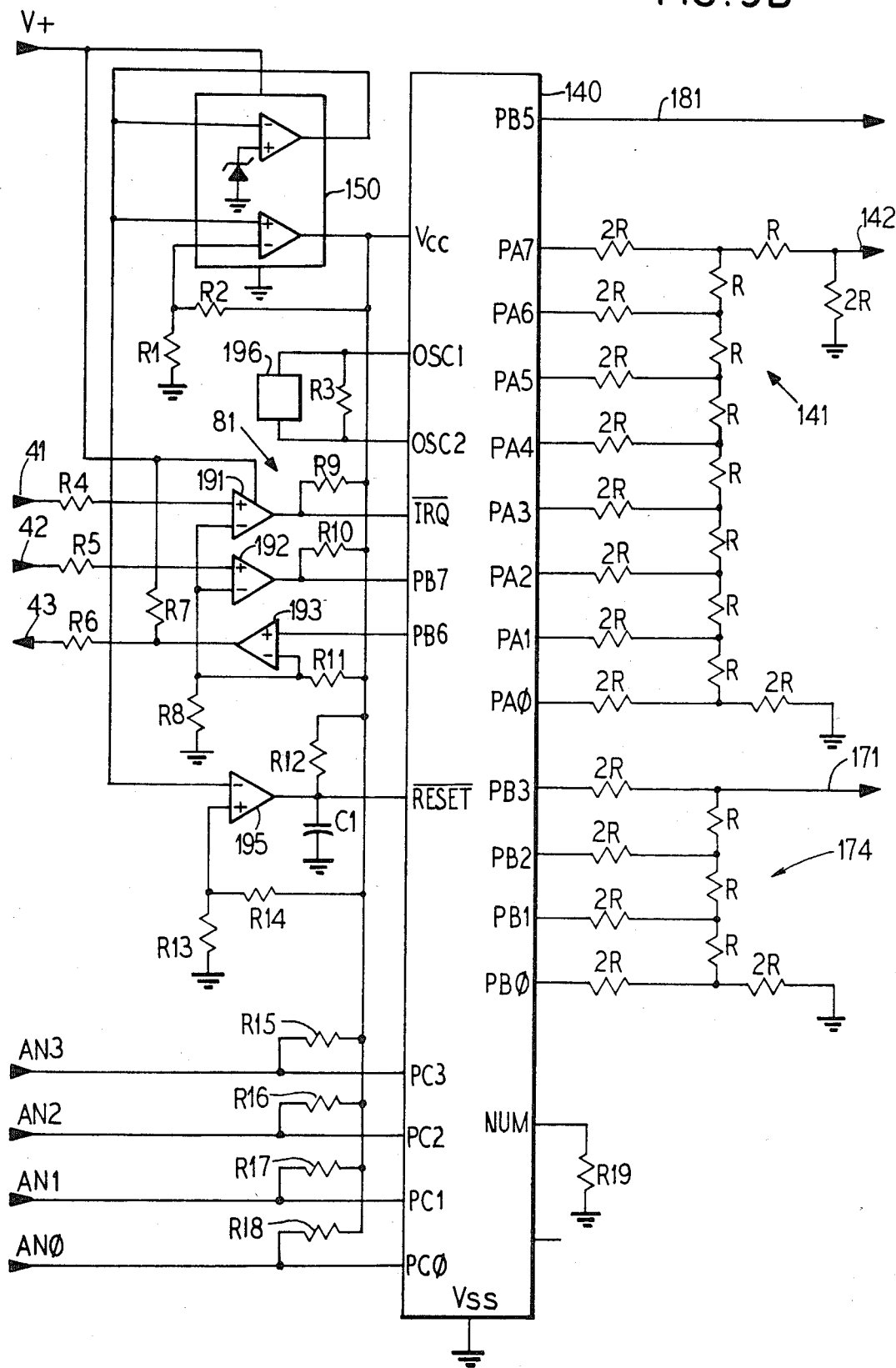

FIGS. 9A and 9B illustrate a more detailed circuit implementation in accordance with the block diagram of FIG. 5. In FIG. 9A the battery pack is schematically indicated at 20 and is shown as having a precision resistance element 131 permanently in series therewith for the purpose of sensing battery current during charging and discharging operations. By way of example, element 131 may have a resistance value of one-tenth ohm with a precision of one percent. The battery pack 20 also has associated therewith a precision voltage sensing arrangement comprising resistance elements 132 and 133. The resistance value of elements 132 and 133 in series is sufficiently high so that only a negligible battery current flows in this voltage sensing circuit. A battery temperature sensing transducer 134 is shown as being physically disposed in heat transfer relation to the battery pack 20. A precision resistance element 135 is shown in series with the transducer 134 for the purpose of supplying a voltage representative of battery temperature during a charging operation.

For the purpose of sensing charging voltage during a battery charging operation, precision resistance elements 136 and 137 are illustrated as being connected with the battery charging voltage input "+CHG". The resistance values of the voltage divider are selected such that the voltage across resistance element 137 will accurately represent the charging voltage during a battery charging operation. Analog to digital converter means is associated with the respective battery parameter sensing elements so as to convert the measurements into digital form. In the particular circuit embodiment illustrated in FIGS. 9A and 9B, this conversion operation is carried out with the use of programmed processor circuitry 140, FIG. 9B. The processor circuitry 140 controls an eight-bit R/2R ladder network 141 having an analog output at 142. The analog output line 142 is connected to comparators 151 through 154 shown in FIG. 9A and supplies a common analog reference voltage to the non-inverting inputs of these comparators. The inverting inputs 161 through 164 of the comparators 151 through 154 are coupled with the respective battery parameter sensing circuits. In a specific implementation, the processing circuitry 140 is implemented with a power supply voltage of three volts which may be obtained from a very accurate stable voltage reference supply/amplifier device 150. By utilizing a voltage reference as the power source for the processing circuitry 140, the output ports associated with the ladder network provide an accuracy comparable to that of a conventional digital to analog converter. In the particular embodiment illustrated there is a ninth bit in the most-significant bit location of the ladder network 141. This is provided so as to adapt the ladder network output at 142 to the input common mode voltage range of the comparators 151 through 154. Under worst case conditions, the battery terminal voltage may reach 4.0 volts which limits the common mode input voltage to 2.5 volts, approximately. To achieve eight-bit resolution, the full digital to analog voltage range must be accommodated by the comparators 151 through 154. By configuring the digital to analog converter network 141 as a nine-bit ladder with the most significant bit a logic zero, the lower eight bits of the nine-bit ladder remain, giving a resultant digital to analog voltage range of:

$$0 \text{ V.} \leq D/A \text{ output} \leq \frac{255}{511} V\text{ref.} (= 1.497 \text{ V})$$

$$V_{step} = \frac{V\text{ref.}}{511} = 5.87 \text{ mv/step, 256 steps}$$

so:
digital output 0=0 volts
digital output 225=1.497 volts

Figure 10:
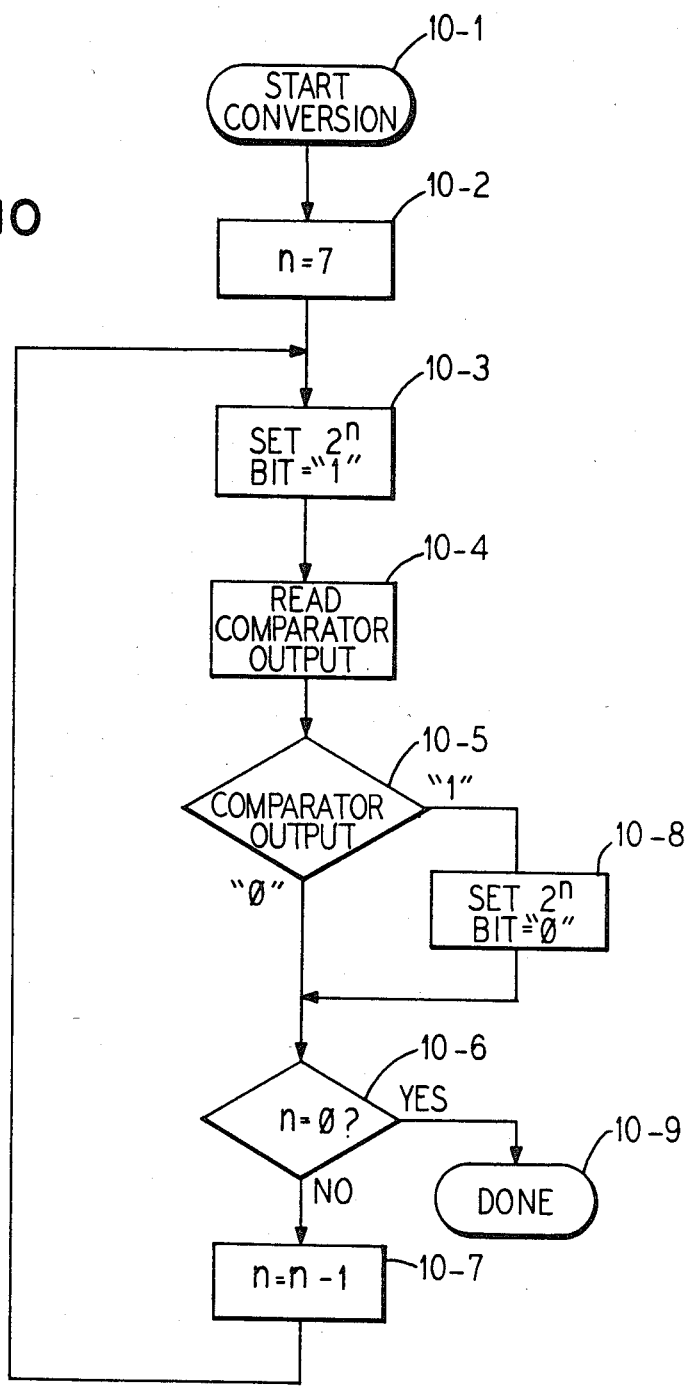
FIG. 10 is a flow diagram for illustrating an exemplary control program for carrying out analog to digital conversion of battery parameter values utilizing the particular exemplary circuit of FIGS. 9A and 9B.

With this digital to analog converter as a building block, a successive approximation analog to digital converter can be implemented with the voltage comparators 151 through 154 FIG. 9A and a straightforward microprocessor algorithm (as represented in FIG. 10).

The successive approximation algorithm depends on the assumption that the analog voltage being measured does not change appreciably during the conversion sequence. The nature of the exemplary application inherently has characteristics of slowly changing parameters with the exception of the discharge current, which can change abruptly and significantly. The solution to this potential difficulty is a low-pass filter amplifier which serves to integrate or average any rapidly changing current fluctuations.

Since the analog to digital converter has a conversion range of 0 to 1.497 volts, the four analog signals to be measured must be scaled appropriately to yield a convenient step resolution by offering measurability over the necessary range of values. The scaling values and step resolutions may be selected as follows:

1. Channel 0: Charge voltage
   step resolution=80 mV
   maximum range: 20.40 volts
2. Channel 1: Discharge current
   step resolution=2 ma
   maximum range: 510 ma
3. Channel 2: Battery terminal voltage
   step resolution=25 mv
   maximum range: 6.375 volts
4. Channel 3: Battery temperature
   step resolution=2° K.
   maximum range: 509 K.=236° C.

Particularly in the case of channel two it might be noted that a four-cell nickel-cadmium battery pack can have a terminal voltage that exceeds 6.375 volts, which is the maximum range of channel two. In the present example, however, no additional useful information would be provided if the battery processor could determine when battery voltage exceeded 6.375 volts.

As previously mentioned, battery discharge current is subject to rapid fluctuations. Accordingly, the channel one current monitor means includes an integration circuit as indicated at 170 in FIG. 9A. The integration circuit 170 has its input connected with the current sensing resistance element 131 and its output connected with input line 163 of comparator 153, FIG. 9A.

Referring to FIG. 9A, an implementation of the battery charging controller 101 of FIG. 5 comprises an analog control line 171 leading to an inverting input of a comparator 172 which controls a battery charging current regulating circuit 173. The battery charging current is controlled by the processor circuitry 140, FIG. 9B, with the use of an additional four bit R/2R ladder network 174. The ladder network 174 supplies an analog command signal via line 171 for controlling components 172 and 173. Thus, the analog command signal can have one of sixteen discrete voltage levels. The output voltage range is from zero volts to 15/16 times the reference voltage level or 2.81 volts, with steps of 187.5 millivolts.

An operational amplifier 176, FIG. 9A, is coupled with the battery current sensing resistor 131 and provides an amplification such that a voltage step of 187.5 millivolts at input 171 of comparator 172, FIG. 9A, is matched by a battery current step of thirty-two milliamperes in resistance element 131. Thus, for a battery current in element 132 of thirty-two milliamperes, a voltage at output line 177 of 187.5 millivolts is supplied to the non-inverting input of comparator 172. The minimum charge current level is theoretically zero; however, finite input offset voltages present in the amplifier 176 predict a potential zero level charge current of six milliamperes maximum. This is insignificant when it is recognized that the only time the zero level charge value will be selected is during the deep cycle function when much larger current levels will be drained from the battery.

In the illustrated battery charging current regulating circuit 173, three power transistors in parallel have separate base resistors for balancing unequal device parameters and ensuring equal current and power dissipation sharing between the devices. A major design consideration in the illustrated embodiment is the power dissipation of the current regulator 173 coupled with the heat associated with the battery pack 20 during the charging cycle, especially during the overcharge portion of the charge cycle which occurs after the battery reaches approximately seventy-five percent of its maximum charge capacity. To retain compatibility with existing charging circuits, the regulated charger 172, 173 must be capable of operating with input charge voltage levels of at least twelve volts. In some instances, the applied charge voltage might exceed eighteen volts. The dissipation is the regulator devices of circuit 173 is given by the equation:

$$P_d = (V_{CHG} - V_{BATT}) I_{CHG}$$

Given worst case conditions:
$V_{CHG}$=18 volts
$V_{BATT}$=4 volts
$I_{CHG}$=480 ma $$P_d = (18-4)(0.48) = 6.72 \text{ watts}$$

It is clear that 6.72 watts exceeds the power dissipation capacity of even three transistors in regulator network 173, and would generate excessive heat within an enclosed unit even if the transistors could handle the charge voltage input. Since the battery voltage is known and the charge current level is selected by the processor circuitry 140, the resultant power dissipation can be directly controlled by the processor circuit 140. This means that essentially constant power operation of the transistors of network 173 can be achieved when high charge voltage conditions exist. If the charge voltage input is reduced to a more efficient level, higher charger currents are possible when conditions permit. The minimum charge voltage input that would still give proper constant current regulation is approximately 7.0 volts, which would result in minimum power dissipation.

According to the teachings of the present invention, the battery pack 20 is to be subjected periodically to a deep discharge cycle, in order that the battery pack can maintain its full rated capacity and exhibit maximum operating life. A suggested discharge cycle to meet this requirement is discharging the battery at a C/10 rate to a terminal voltage of 4.0 volts for a four-cell configuration. A discharge control circuit for this purpose is indicated at 180 in FIG. 9A, the control input 181 being controlled from the processor circuitry 140 as indicated in FIG. 9B.

A deep discharge of battery pack 20 would not normally occur in the typical usage contemplated for the illustrated embodiment since normally the battery pack and associated portable system is used less than fourteen hours per day, while the design operating time for the battery pack is typically twenty hours. Furthermore, most logic devices and LSI circuits such as those utilized to implement component 71 of FIG. 5, will not function at 4.0 volts. The illustrated embodiment performs the deep discharge function by switching a resistive load 182, FIG. 9A, across the battery 20 that causes current to be drained out at a predetermined rate, typically C/10. During the deep discharge cycle, not only is the battery conditioned, but further, according to the teachings of the present invention, the available capacity of the battery is measured. By measuring the available capacity of the battery, a battery "life history" can be maintained that has important diagnostic potential. If the available capacity begins to decrease past predetermined values, the user can be alerted, for example, via the terminal display circuits component 72, FIG. 5, before a fault or field failure occurs. The battery current sensor element 131 and integrator circuit 170 may be utilized to measure battery capacity during the deep discharge cycle.

In order to allow the battery to be discharged down to a deep discharge level corresponding to an output voltage of 4.0 volts, an auxilliary power source should be available to power the logic in the portable terminal device of FIG. 5 during the deep discharge cycle. A power regulator circuit may be built into the portable terminal device that regulates 5.0 volts from either the battery 20 or the charge voltage input terminal "+CHG", whichever is higher in potential. The net result of this power control arrangement is to completely remove the terminal load from the battery whenever the system receives power from a charger. For the case of a portable terminal device having data in a volatile memory, it is necessary that the charge voltage input not be interrupted during a deep cycle sequence. A message at the display 12, FIG. 1, can inform the user that the deep cycle sequence is in progress and that the terminal device should not be used until the cycle is completed. To minimize the impact of this operation on the user, the deep cycle function including a full discharge followed by a normal charge cycle will be initiated by the application program in the terminal device so that a convenient non-interferring time can be selected for this relatively long duration function, for example, over a weekend.

The key to utilizing the functional capabilities of the battery processor 140 is to provide for digital communication between the battery processor and the terminal processor circuitry. A digital interface 81 has been indicated in FIG. 5 for this purpose and exemplary detailed circuitry in FIG. 9B has been given the same reference numeral. The interface 81 may process the following three data signals:

1. BPCLK: Battery Processor Clock (from terminal)
2. BPWDATA: Battery Processor Write Data (from terminal)
3. BPRDATA: Battery Processor Read Data (from battery processor)

These three signals are protected from damage by static discharge by means of one hundred kilohm resistors in line with each input or output. The battery processor interface utilizes voltage comparators 191, 192 and 193 which are relatively immune to static damage. At the terminal, CMOS devices are used, therefore 4.7 volts Zener diodes are provided to further protect these more sensitive components. The voltage comparators 191, 192 and 193 perform the additional function of level conversion between the battery processor operating at 3.0 volts and the terminal logic operating at 5.0 volts. The open collector outputs of the comparators are pulled up by resistors connected to the appropriate power supply to ensure proper logic levels in either direction.

The communication protocol is based on the terminal processor controlling data transfers by issuing a clocking signal to the battery processor. The battery processor has the capability of requesting service by causing an interrupt to the terminal processor when it pulls the BPRDATA signal from its rest "1" condition to a "0". This signal has a resistor pull down on the terminal side of the interface, so an interrupt will automatically occur whenever the battery pack is removed from the terminal.

It is recognized that complete discharge of the battery can occur. In this case, information stored in the battery processor circuitry 140 will be lost but the system must be able to restore itself and properly recover and recharge the battery. To ensure such recovery, a voltage comparator 195 monitors the 3.0 volt power supply 150 and forces a $\overline{\text{RESET}}$ condition if the voltage supplied to the processor goes out of range. When the battery pack is again placed on charge, the battery processor circuitry 140 will restart and the control program will re-establish execution and control of the battery system.

Where the battery pack assembly 18 could be accidentally inserted upside-down, and reverse the electrical connections, to prevent damage or operational faults, the interface signals are shown as being arranged so that no high powered signals are connected to other high powered signals if reversed. All reversed connections terminate through the 100 kilohm protection resistors at the strap conductors 41–44, limiting currents to safe levels.

By way of example, processor circuitry 140 may be implemented by means of a single chip microprocessor such as the MC146805F2 which is a high performance CMOS derivative of the MC6805, with a reduced pinout arrangement that allows pckaging in the JEDEC standard twenty-eight pin leadless chip carrier. Features of this device include:

1. Operation at $V_{CC} = 3.0$ V
2. Low power standby "sleep" mode with self wake-up
3. External interrupt
4. Miniature package
5. CMOS port structure
6. On chip clock oscillator By way of example, a one megahertz crystal is indicated at 196' in association with the clock oscillator terminals of circuitry 140.

DESCRIPTION OF FIG. 10

FIG. 10 illustrates a successive approximation algorithm for carrying out analog to digital conversion with respect to one of the battery parameters sensed by the circuitry of FIG. 9A.

By way of specific example, if a battery charging operation is to take place and if the charge voltage at "+CHG" is 14.385 volts, then the voltage at input 164 of comparator 154 will have a value of 1.050 volts. Thus, at the start of a conversion operation for obtaining a digital measurement of charge voltage, as represented at 10-1 in FIG. 10, the analog voltage at the reference input line 142 will be at zero volts, and the output of comparator 154, designated AN0 (channel 0) will be at logical zero level.

As represented at block 10-2 in FIG. 10, for the case of an eight-bit digital to analog converter network 141 as previously described, a variable n is initially assigned a value seven. According to step 10-3, a logical one value is thus assigned to the highest order output port of processor 140. The result is that the reference line 142 receives an analog output voltage corresponding to $2^7$ or 128 voltage increments (about 0.751 volts). Since the analog reference value at line 142, FIG. 9A, is still less than the analog voltage at line 164, comparator 154 continues to supply a logical zero signal to the processor 140.

According to the block 10-4 of FIG. 10, the comparator output logic level is read by the processor, and according to decision block 10-5 where the comparator output is at a logical zero, processing continues via block 10-6 to block 10-7, whereby the variable n is assigned the new value six.

Thereupon, upon return to step 10-3, a logical one signal is produced at the second highest order output port of processor circuit 140, so That a total of 192 voltage increments is supplied at analog reference line 142 (a voltage of about 1.127 volts). If the voltage level at line 164, FIG. 9A, is 1.050 volts, then the voltage level at line 142 now exceeds the voltage level at line 164, and the output of comparator 154 is at a logical one level. Accordingly at the decision step 10-5, the program branches to block 10-8, whereby the bit with the weight of $2^6$ is set to a logical zero value. Then according to step 10-6 and step 10-7, the variable n is set to five, and according to step 10-3 the bit with the weight of $2^5$ is set to a logical one value. Accordingly, analog reference line 142 receives a voltage of 160 voltage units (0.939 volts). Since the analog reference level at line 142 is now less than the analog value at line 164, comparator 154 supplies a logical zero signal, and processing continues through steps 10-4, 10-5 and 10-6. Next according to step 10-7, the variable n is set to a value of four, and so on. When finally the bit having a weight of $2^0$ has been set by the procedure of FIG. 10, the program branches to 10-9, and the analog input value at 164, FIG. 9A, has been converted into a corresponding digital value which may be stored in the memory of component 140 for further processing.

DESCRIPTION OF TABLES A AND B

On the following pages a Table A and a Table B pertaining to the battery processor component 82, FIG. 5, are set forth. In Table A, various suggested hexadecimal (HEX) codes are set forth which may be utilized in conjunction with the keyboard 11 (FIG. 1), for transmitting commands to the battery processor. In the case of hexadecimal codes 30 (HEX) through 35 (HEX), the requested battery information is transmitted by the battery processor via the digital interface 81, FIG. 5, for display on the terminal display screen 12, FIG. 1.

Table B illustrates the type of data which may be stored at respective memory locations of the memory circuits of component 82, FIG. 5. While the Tables are considered selfexplanatory, a few comments on Table B are presented subsequent to the Tables:

TABLE A

BATTERY PROCESSOR: COMMAND FORMAT

| CODE (HEX) | FUNCTION |
| --- | --- |
| 00 | Error recovery RESET |
| 01 | Read STATUS (one byte returned) |
| 02 | RESET ALL, Begin history |
| 10 | Read analog channel 0 ⎫ |
| 11 | Read analog channel 1 ⎬ one byte returned |
| 12 | Read analog channel 2 ⎭ |
| 13 | Read analog channel 3 |
| 20 | Set low reserve alert point (one byte sent) |
| 21 | Set low voltage alert point (one byte sent) |
| 22 | Set minimum capacity alert (one byte sent) |
| 30 | Read fuel gauge (one byte returned) |
| 31 | Read maximum available capacity (one byte returned) |
| 32 | Read charge cycle count (two bytes returned) |
| 33 | Read deep cycle count (two bytes returned) |
| 34 | Read accumulated hours used (two bytes returned) |
| 35 | Read use history indicator (four bytes returned) |
| 40 | Initiate deep cycle function |

TABLE B

BATTERY PROCESSOR: DATA DEFINITIONS
STATUS:

| 7 | 6 | 5 | 4 | 3 | 2 | 1 | 0 |

1 = COLD START, NO HISTORY
 1 = CHARGE IN PROGRESS
 1 = DEEP CYCLE IN PROGRESS
 1 = LOW RESERVE CONDITION
 1 = LOW VOLTAGE CONDITION
 1 = IMPROPER CHARGE VOLTAGE
 1 = CHARGE CYCLE INCOMPLETE
 1 = MINIMUM CAPACITY ALERT

ANALOG VALUES:

| 7 | 6 | 5 | 4 | 3 | 2 | 1 | 0 |  8-BIT VALUES SCALED BY BATTERY PROCESSOR AS FOLLOWS:

CH. 0: CHARGE VOLTAGE, 80 mV/STEP, 20.4 VOLTS MAX
CH. 1: DISCHARGE CURRENT, 2 ma/STEP, 510 ma MAX
CH. 2: BATTERY TERMINAL VOLTAGE, 25 mV/STEP, 6.375 VOLTS MAX
CH. 3: BATTERY TEMPERATURE, 2° K./STEP (ABSOLUTE)

LOW RESERVE ALERT POINT:

| 7 | 6 | 5 | 4 | 3 | 2 | 1 | 0 |

8-BIT VALUE, 1 ≦ LOW RESERVE ALERT POINT ≦ 99
DEFAULT VALUE: 20 = 14(HEX) (20% RESERVE)
SCALED BY BATTERY PROCESSOR AS % C
REMAINING WHEN LOW RESERVE INTERRUPT
GIVEN TO TERMINAL PROCESSOR
LOW VOLTAGE ALERT POINT:

| 7 | 6 | 5 | 4 | 3 | 2 | 1 | 0 |

TABLE B-continued

8-BIT VALUE, 0 ≦ LOW VOLTAGE ALERT POINT ≦ 255
DEFAULT VALUE 190 = 0BE(HEX) (4.75 VOLTS)
SCALED BY BATTERY PROCESSOR AS 25 mV/STEP
MINIMUM CAPACITY ALERT:

| 7 | 6 | 5 | 4 | 3 | 2 | 1 | 0 |

8-BIT VALUE, 0 ≦ MINIMUM ALERT ≦ 255
10 ma − HR/STEP, 2550 ma − HR MAX.
DEFAULT VALUE: 0 (ESSENTIALLY DISABLED)
WHEN MAXIMUM AVAILABLE CAPACITY
(AS MEASURED BY DEEP CYCLE FUNCTION)
DECREASES TO THIS LEVEL,
AN INTERRUPT ALERT IS GIVEN TO THE
TERMINAL PROCESSOR.
MAXIMUM AVAILABLE CAPACITY (C):

| 7 | 6 | 5 | 4 | 3 | 2 | 1 | 0 |

8-BIT VALUE, 0 ≦ C ≦ 255
10 ma − HR/STEP, 2550 ma − HR MAX.
MEASURED AND SET DURING DEEP
DISCHARGE FUNCTION
DEFAULT VALUE: 100 = 64(HEX)
CHARGE CYCLE COUNT:

BYTE 1 (MS) | 7 | 6 | 5 | 4 | 3 | 2 | 1 | 0 |

BYTE 0 (LS) | 7 | 6 | 5 | 4 | 3 | 2 | 1 | 0 |
16-BIT VALUE, INITIALIZED TO 0
COUNTS NUMBER OF CHARGE CYCLES INITIATED
DEEP CYCLE COUNT:

BYTE 1 (MS) | 7 | 6 | 5 | 4 | 3 | 2 | 1 | 0 |

BYTE 0 (LS) | 7 | 6 | 5 | 4 | 3 | 2 | 1 | 0 |
16-BIT VALUE, INITIALIZED TO 0
COUNTS NUMBER OF DEEP DISCHARGE-RECHARGE
CYCLES
ACCUMULATED HOURS:

BYTE 1 (MS) | 7 | 6 | 5 | 4 | 3 | 2 | 1 | 0 |

BYTE 0 (LS) | 7 | 6 | 5 | 4 | 3 | 2 | 1 | 0 |
16-BIT VALUE, INITIALIZED TO 0
COUNTS ACTUAL HOURS OF USE DELIVERING CURRENT
USE HISTORY INFORMATION: (4 BYTES)

BYTE 3 | 7 | 6 | 5 | 4 | 3 | 2 | 1 | 0 |
8-BIT VALUE, COUNTS NUMBER OF TIMES OVER
VOLTAGE ON CHARGE EXPERIENCED

BYTE 2 | 7 | 6 | 5 | 4 | 3 | 2 | 1 | 0 |
8-BIT VALUE, COUNTS NUMBER OF TIMES TEMP
EXCEEDED 45° C. DURING CHARGE

BYTE 1 | 7 | 6 | 5 | 4 | 3 | 2 | 1 | 0 |
8-BIT VALUE, AVERAGED DEPTH OF DISCHARGE
DURING USE, % C

BYTE 0 | 7 | 6 | 5 | 4 | 3 | 2 | 1 | 0 |
8-BIT VALUE, CHANGE IN AVAILABLE CAPACITY
FROM MAXIMUM OBSERVED
FUEL GAUGE:

| 7 | 6 | 5 | 4 | 3 | 2 | 1 | 0 |
8-BIT-VALUE, 0 ≦ FUEL GAUGE VALUE ≦ 100
SCALED BY BATTERY PROCESSOR AS % C REMAINING

Referring to the STATUS word of Table B, for a new battery pack for example, for which no prior history has been recorded, bit zero of the STATUS word would be placed in a logical one condition representing a cold start of battery history. The remaining bits of the STATUS word could be at a logical zero level.

Various of the storage locations represented in Table B have default values which the locations receive in the absence of a particular selected value at the time of start up. For example, a LOW RESERVE ALERT POINT register would be set at a hexadecimal (HEX) value representing an alert point corresponding to a remaining capacity of the battery of 20% of its rated capacity. Thus, in the absence of a different setting, the battery processor would transmit an interrupt to the terminal processor (indicated at 71 in FIG. 5) when the battery had been discharged to such an extent that only a 20% reserve of capacity remained.

The CHARGE CYCLE COUNT of Table B, on the other hand, would be initialized to zero.

While the essential features of the invention will be fully understood from the foregoing description, it is proposed to include hereinafter certain further exemplary details concerning a specific implementation of an illustrative overall battery system. It should be understood, however, that the scope of the invention is defined by the claims hereof, and that specific details are given solely by way of example and not by way of limitation. An embodiment of the invention as defined in the claims is readily implemented by one of ordinary skill in the art without reference to the following elaboration.

Applicant would emphasize that the various features of the invention have substantial utility when practiced separately. For example, a non-reachargeable battery system with means for monitoring battery discharge current and automatically alerting the user when battery energy has been reduced to a selected value would have important utility dependent of other features. A simplification of the disclosd portable system could be made by utilizing a non-portable system to insert a measured value of battery capacity into the memory of the battery system after each deep discharge cycle. For example the deep discharge and charging cycles might be controlled by a separate non-portable computer system at a central charging station. This computer system might be capable of communication with the memory of the battery system for inserting an accurate actual measurement of battery capacity. For the case of a central computer controlled charging station, the central computer could interrogate the memory of the battery system for relevant battery history and then selectively determine a suitable charging voltage and charging current. At selected times, the central computer could determine that the battery should be fully charged and then deep discharged to measure its actual capacity.

DESCRIPTION OF FIG. 11

Figure 11:
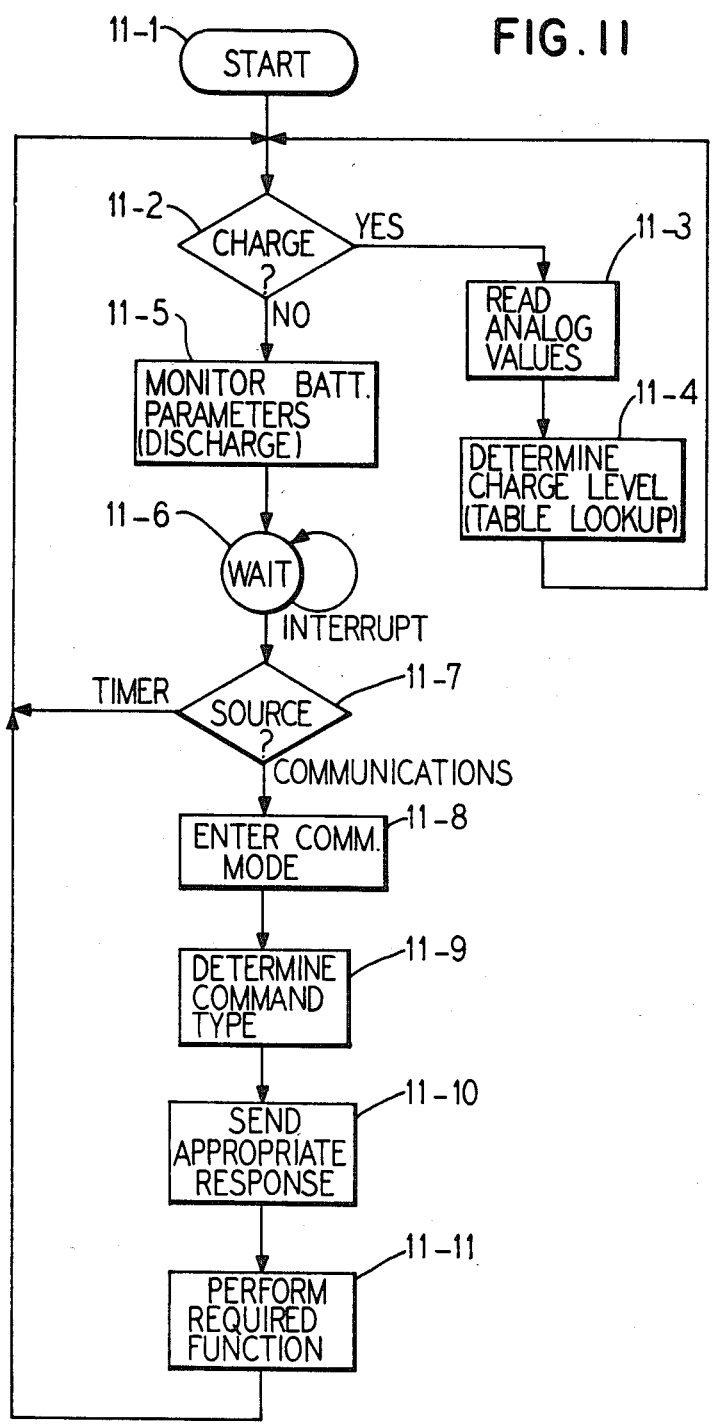
FIG. 11 is a flow diagram illustrating the general battery processor control program utilized in conjunction with simplified system currently in use.

FIG. 11 is a flow chart showing the general control program for the battery processor. During start of the system as represented by block 11-1 various storage locations of the memory of component 82, FIG. 5, may be initialized.

With respect to decision block 11-2, the battery processor, for example, may interrogate the battery charging voltage monitor 103, FIG. 5, to determine if a charging voltage is present. If a charging voltage is present, control branches as indicated at 11-3 and 11-4 to obtain the optimum value of battery charging current. Otherwise as represented by blocks 11-5 and 11-6, the battery processor effects the monitoring of battery parameters so as to update the battery information of Table B at suitable intervals.

As represented by decision block 11-7, upon receipt of an interrupt, the battery processor determines if the source of the interrupt signal was the battery processor timer, in which case control returns to decision block 11-2. On the other hand if the source of the interrupt signal was a communication from the keyboard 11 of terminal device 10, processing continues as indicated at 11-8. The respective command types pursuant to blocks 11-9 through 11-11 correspond to the respective code groups of Table A. Following execution according to block 11-11, the control program returns to block 11-2.

DESCRIPTION OF TABLE C AND D

Exemplary circuit components and resistance and capacitance values for FIGS. 9A and 9B are shown in the following TABLES C and D.

TABLE C (FIG. 9A)

| | |
|---|---|
| Comparator 172 | LM10B |
| Transistors $T_1$, $T_2$, $T_3$ | ZTX750 |
| Resistors $R_a$, $R_b$, $R_c$ | 2.2 kilohms, each |
| Schottky Diodes $D_1$, $D_2$, $D_3$ | IN5819 |
| Circuit 180 | Darlington NPN |
| Resistors 182 | 47 ohms, ½ watt, each |
| Resistor 132 | 32.4 kilohms, 1% |
| Resistor 133 | 10 kilohms, 1% |
| Transducer 134 | AD 590 |
| Battery 20 | 2.2 ampere hour four cells × ½ D Polytemp Nickel-Cadmium |
| Resistor 131 | .1 ohm, 1% |
| Amplifier of 170 | CA 3260 |
| Resistor $R_d$ | 29.4 kilohms, 1% |
| Capacitor $C_a$ | .1 microfarad |
| Resistor $R_e$ | 1 kilohm, 1% |
| Amplifier 176 | CA 3260 |
| Resistor $R_f$ | 57.6 kilohm, 1% |
| Capacitor $C_f$ | .1 microfarad |
| Resistor $R_i$ | 1 kilohm, 1% |
| Resistor 135 | 2.94 kilohm, 1% |
| Resistor 136 | 127 kilohms, 1% |
| Resistor 137 | 10 kilohms, 1% |
| Comparators 151–154 | LM 339 |

TABLE D (FIG. 9B)

| | |
|---|---|
| Voltage Regulator 150 | LM10B |
| Resistor $R_1$ | 10 kilohms, 1% |
| Resistor $R_2$ | 140 kilohms, 1% |
| Crystal 196 | 1 megahertz |
| Resistor $R_3$ | 10 megohms |
| Resistors $R_4$, $R_5$, $R_6$, $R_8$ | 100 kilohms each |
| Resistor $R_7$ | 20 kilohms |
| Comparators 191–193 | LM 339 |
| Resistors $R_9$, $R_{10}$, $R_{11}$ | 100 kilohms each |
| Comparator 195 | LM 339 |
| Resistor $R_{12}$ | 100 kilohms |
| Capacitor $C_1$ | .1 microfarad |
| Resistor $R_{13}$ | 10 kilohms, 1% |
| Resistor $R_{14}$ | 127 kilohms, 1% |
| Resistors $R_{15-18}$ | 100 kilohms, each |
| R Resistance Values | 100 kilohms, 1%, each |
| 2R Resistance Values | 200 kilohms, 1%, each |
| Resistor $R_{19}$ | 10 kilohms |
| Processor Circuit 140 | MC 146805F2 |

DESCRIPTION OF FIG. 12

Figure 12:
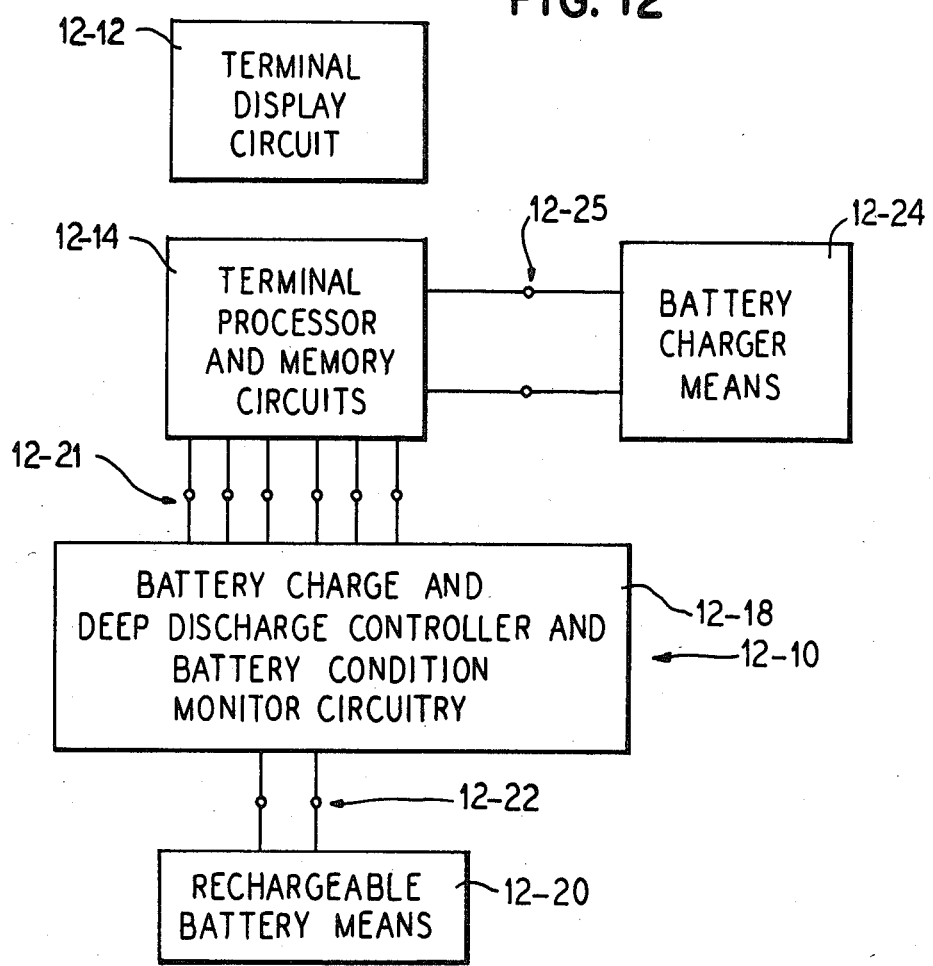
FIG. 12 is a block diagram of a simplified portable battery powered device in accordance with the present invention associated with a battery charger means, and also serves to illustrate a stationary battery conditioning system for spare battery packs.

FIG. 12 illustrates a simplified embodiment of a portable battery powered system in accordance with the present invention. Reference numeral 12-10 represents a portable utilization device which may have the same appearance and characteristics as described for the device 10 shown in FIG. 1. Thus the device 12-10 may have a terminal display circuit 12-12 associated with a display region such as indicated at 12 in FIG. 1 and may include processor and memory circuits 12-14 including a microprocessor located generally as indicated at 14 in FIG. 2. Battery charge and deep discharge controller and battery condition monitor circuitry 12-18 could correspond with the circuitry previously described in FIGS. 5, 9A and 9B, with the difference that the circuitry is permanently associated with the portable device 10 and is located in a space adjacent to space 14 of FIG. 2 rather than being a permanent part of the battery pack as indicated in FIGS. 3 and 4. Thus, in the embodiment of FIG. 12 a rechargeable battery means is indicated at 12-20 and may comprise four nickel-cadmium cells supplying a nominal output voltage of five volts and having the characteristics previously described including those indicated in FIGS. 6, 7 and 8. In the simplified embodiment of FIG. 12, however, the rechargable battery means 12-20 is readily detachable from the circuitry 12-18 so as to be removable and replaceable without disturbing circuitry 12-18. By way of example circuitry 12-18 may be installed on a separate board which fits within the housing of the device 10 of FIG. 1 in the same way as the microprocessor board located at 14 in FIG. 2. In FIG. 12, small circles have been applied to represent a quick disconnect coupling between components 12-14 and 12-18. Thus, the terminal conductors of component 12-14 may be readily disconnected at 12-21 from the circuitry 12-18 and connected instead to output devices such as indicated at 51 in FIGS. 2 and 5, so that components 12-12 and 12-14 may be readily adapted to cooperate with the battery system of FIGS. 3 and 4 including the circuitry of FIGS. 9A and 9B.

For the simplified embodiment of FIG. 12, conventional spring type coupling has been indicated at 12-22 between circuitry 12-18 and battery means 12-20, so that a conventional battery pack is automatically coupled with the circuitry 12-18 when inserted into the portable device 12-10. By way of example, device 12-10 may correspond essentially to a portable data terminal of Norand Corporation identified as the NT 121 data terminal, modified to include component 12-18 and receiving a conventional nickel cadmium battery pack by means of a releasable coupling at 12-22 corresponding to that utilized in the commercial device. In the commericial system, the battery pack may be charged by coupling of component 12-14 to a battery charger means such as indicated at 12-24, for example by means of a plug and socket coupling indicated at 12-25. Component 12-14 when associated with a battery charger means may supply a charging voltage output (+CHG) as indicated in association with terminal 44 in FIG. 5, while component 12-14 may receive battery output voltage (V+, ground) from the battery means 12-20 via circuitry 12-18, as indicated in association with terminals 45 and 46 in FIG. 5. In an embodiment corresponding to that previously described, circuitry 12-18 would correspond to components 81, 82, 83, 91, 92, 93, 101, 103 and 110 of FIG. 5, for example. In a simplified specific embodiment, component 12-18 may utilize circuitry such as illustrated in FIG. 13.

DESCRIPTION OF FIG. 13

Figure 13:
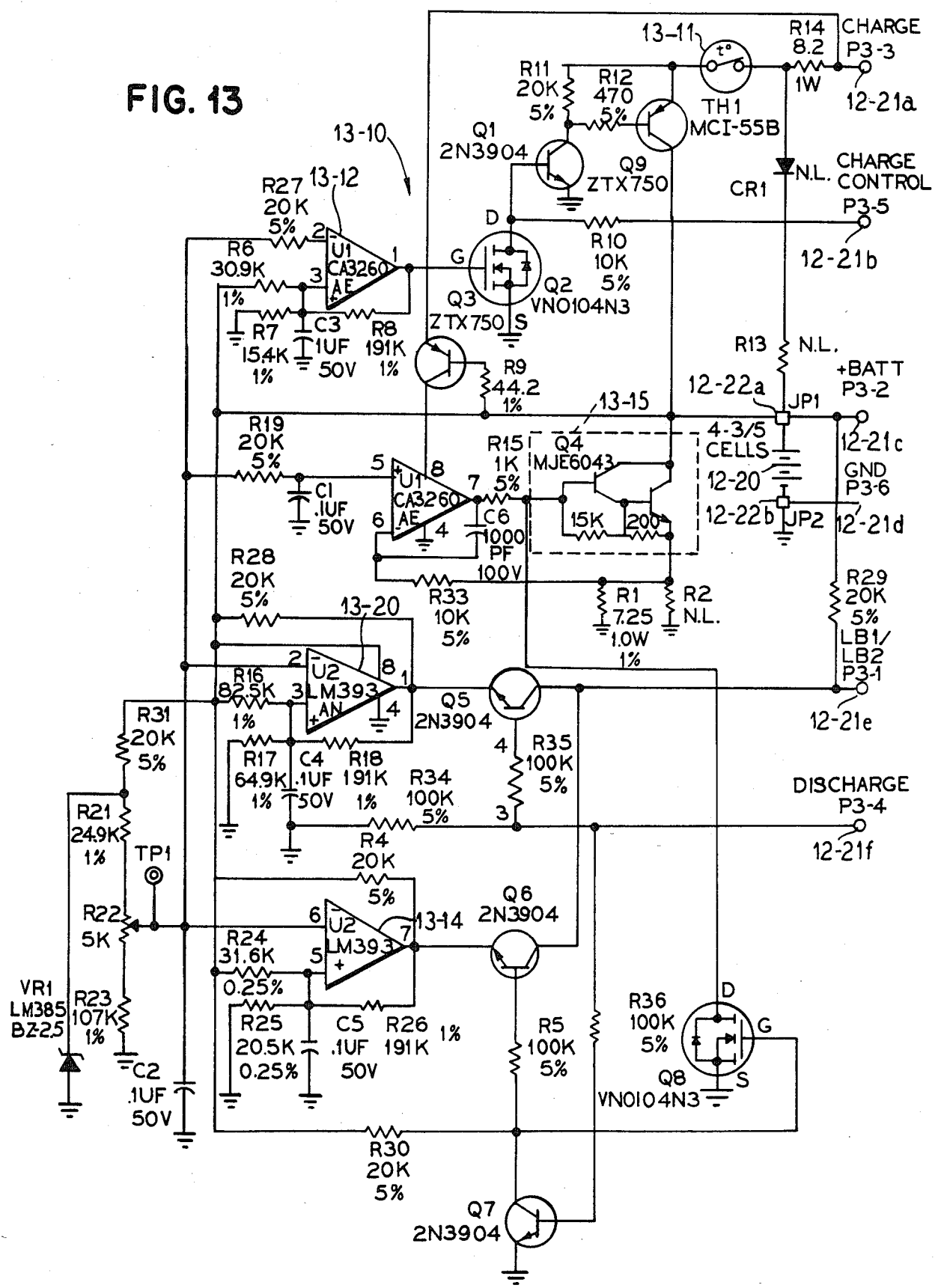
FIG. 13 shows a specific implementation of the battery charge and deep discharge controller and monitor circuitry which is represented as a labeled rectangle in FIG. 12.

FIG. 13 illustrates a specific battery charge and deep discharge controller and battery condition monitor circuit corresponding to component 12-18 of FIG. 12. The circuit 13-10 of FIG. 13 may be implemented as a printed circuit board for insertion into the previously mentioned model 121 portable data terminal such as illustrated in FIG. 1. For the sake of correlating the circuit of FIG. 13 with the illustration of FIG. 12, the terminals at the right hand side in FIG. 13 have been designated 12-21a through 12-21f to indicate there correlation with the quick disconnect coupling indicated at 12-21 in FIG. 12 between components 12-14 and 12-18.

For the specific commercial device previously identified, terminal 12-21a receives charging current of 0.66 amperes from a constant current circuit of component 12-14 which in turn is energized from battery charger means 12-24. Terminal 12-21a is thus designated by the notation "CHARGE".

Terminal 12-21b at the right in FIG. 13 receives a logical control signal from component 12-14. For example, with terminal 12-21b in a high potential condition, the charging current through transister Q9 is at a value corresponding to rated capacity in ampere hours divided by 8.3 hours (C/8.3 amperes). With terminal 12-21b at a low logical potential level, the charging current has a value of full capacity divided by 100 (C/100). Switch 13-11 provides over temperature protection and may operate at a temperature 55 degrees centigrade.

Comparator 13-12 may sense an over-voltage condition and may receive a reference input of 2.000 volts at its upper inverting input.

Terminal 12-21b is designated by the legend "CHARGE CONTROL" and may be controlled from the programmed processor of component 12-14.

Battery 12-20 has been indicated in FIG. 13 operatively engaged with coupling elements which are indicated at 12-22a and 12-22b. The battery 12-20 is coupled by a terminal 12-21c and 12-21d with the component 12-14 for supplying operating power to the portable device during normal operation thereof.

Terminals 12-21e and 12-21f are utilized to effect an automatic deep discharge cycle. When terminal 12-21f is at a logical low potential state, terminal 12-21e provides a signal LB1 which in the high logical potential condition represents a low battery condition as sensed by comparator 13-14.

When terminal 12-21f is at a logical high potential condition, transistor Q7 is turned on, so as to activate the constant current discharge circuit including component 13-15. By way of example, the discharge of battery 12-20 may be at a rate of full capacity divided by five hours (C/5 amperes). During discharge operation, comparator 13-20 is active and provides a logical high potential signal (LB2) when a discharge value of battery potential, for example 3.8 volts, has been detected. For the specific battery referred to, comparator 13-12 may be activated at a voltage value of 6.2 volts, and then be reset when battery voltage is reduced to a value of 5.4 volts. Comparator 13-14 may be activated at a low battery voltage value of 4.65 volts, and be reset when the battery 12-20 has been charged above a voltage value of 5.4 volts. Comparator 13-20 may be activated at a discharge voltage value of 3.8 volts and then be reset when the battery 12-20 has been recharged to a voltage value above 5.4 volts, for example.

Terminal 12-21e is designated with the legend "LB1/LB2) and the terminal 12-21f is labeled with the legend "DISCHARGE".

By way of example, it will be apparent that the system of FIG. 12 may serve as a stationary battery conditioning system for removably receiving spare battery packs. Such a system could correspond to that illustrated in FIG. 1, but with the housing of device 10 permanently fastened to a stationary supporting frame. Conveniently, a removable cover such as 17 could be replaced by a quick access lid with a simple hinge, or the battery space for a conventional battery pack could be simply left open. Of course, a corresponding circuit could be made with heavier parts of the like specifically for stationary operation.

DESCRIPTION OF FIG. 14

Figure 14:
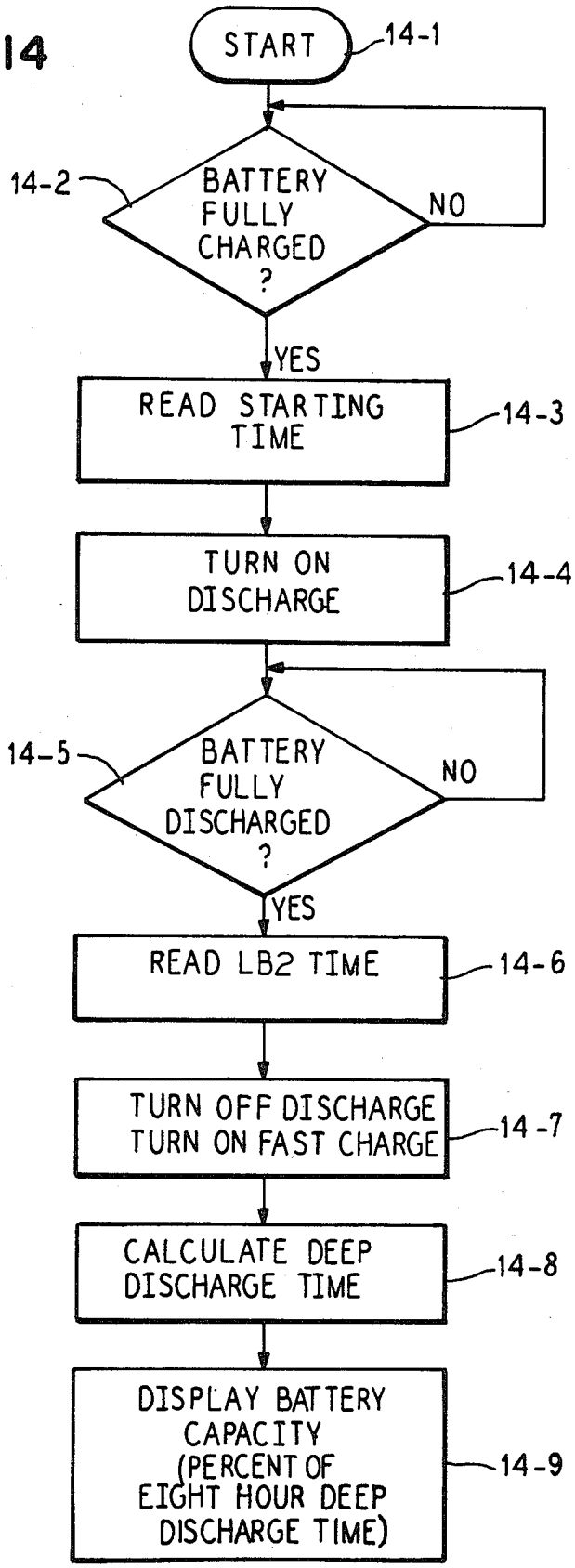
FIG. 14 is a flow diagram indicating the operating means for effecting an automatic discharge cycle with the specific circuitry of FIG. 13.

FIG. 14 illustrates exemplary automatic operation of the system of FIGS. 12 and 13 in conducting a test of battery capacity. When a portable system 12-10 is plugged into battery charger means 12-24, a deep discharge and recharge of the battery may be carried out. Such a procedure should be performed at least once a month to maintain the storage capacity of the battery. With the battery 12-20 fully recharged, a capacity measurement function as indicated in FIG. 14 may be performed when convenient. In the illustrated embodiment, the result of the capacity test is an indication of a percentage equal to the discharge time observed during a deep discharge cycle divided by eight hours. A value exceeding eighty percent may indicate that the batteries are still functioning adequately.

Referring to FIG. 14, a capacity test may be initiated by pressing the ENTER KEY, FIG. 1, in response to the prompt CAPACITY TEST? appearing at the display 12. By way of example, this prompt may appear once a conditioning discharge of the battery has been completed. Alternatively, selection of the capacity test function may automatically cause the battery to be discharge and fully charged before the actual capacity test steps of FIG. 14 are automatically carried out. In this case, step 14-2 might read: BATTERY DEEP DISCHARGED AND FULLY RECHARGED?

In the illustrated embodiment, step 14-2 may correspond with waiting until a battery charge timer indicates full charge by decrementing to zero from 780 minutes.

Once the battery is fully recharged, the operating system reads the current time as a starting time for the deep discharge cycle.

According to step 14-4, component 12-14 supplies a logical high potential signal to terminal 12-21f, FIG. 13 to initiate a further deep discharge cycle.

In executing step 14-5, the operating system of component 12-14 monitors terminal 12-21e of FIG. 13 for a logical high potential signal indicating that the battery has been discharged to a discharge level of for example 3.8 volts.

According to step 14-6, when a logical high potential signal appears at terminal 12-21e, the current time is read from a clock of component 12-14 as the "LB2 TIME".

By step 14-7, a logical low potential signal is supplied to terminal 12-21f to turn off the discharge circuit, and a logical high potential signal is supplied to terminal 12-21b to initiate a fast recharge of the battery.

For step 14-8, the processor of component 12-14 obtains the difference between the LB 2TIME and the starting time, as a measure of the time required for the deep discharge cycle. Where with a battery in good condition the deep discharge cycle requires eight hours, the calculation of step 14-8 obtains the percentage value of the observed deep discharge time in comparison to a discharge time of eight hours.

Pursuant to step 14-9, component 12-14 may cause the calculated deep discharge time to be displayed at the display means 12 of FIG. 1. For example, if the observed deep discharged time were six hours, the display might show: "BATT PERCENT=75".

An outline of a battery discharge subroutine (PSBAT1P) for the commercial model 121 portable data terminal is set forth on the following pages, followed by a program listing of this subroutine.

DESCRIPTION OF AN EXEMPLARY COMPUTER PROGRAM FOR AN EMBODIMENT ACCORDING TO FIGS. 12-14

A battery discharge program has been written and is in use for the model 121 portable data unit which has been described in connection with FIGS. 12-14 of the present drawings.

The system as represented in FIG. 12, comprises operating means including a NSC-800 processor and real time clock, automatically operating according to FIG. 14 under the control of the subroutine which is known as PSBAT1P. A copy of user guide specification for this subroutine is as follows:

COPY OF USER GUIDE SPECIFICATION FOR THE SUBROUTINE PSBAT1P

SUBROUTINE: PSBAT1P

This subroutine has no parameters. In order to access it, it must be declared in the EXTERNALS section of a program, and then linked to the program, according to the conventions of the development system.

GENERAL DESCRIPTION

PSBAT1P is a PL/N battery discharge subroutine written for the NT121 data terminal. This subroutine performs two functions:

(1) It performs a deep discharge and recharge of the terminal.

(2) It measures the storage capacity of the NICAD batteries by timing the time required to discharge the batteries when fully charged.

The capacity test takes twice as long to execute as the simple discharge and recharge function. This is because the batteries must be discharged and charged before the actual capacity test can be performed. The result of the capacity time is a percentage equal to the discharge time divided by eight hours. A value exceeding 80% indicates the batteries are still functioning adequately.

The deep discharge and charge function should be performed at least once a month to maintain the storage capacity of the batteries. The capacity measurment function may be performed when convenient.

It is required that the NT121 remain on charge while the subroutine is executing. If it is taken off charge, an error message will be displayed and program execution will stop. Volatile data in the 121 will be maintained during the deep discharge provided that the unit is not taken off charge while in the low battery mode.

POWER-UP

When IPSDISP has been called from a main program the following message will be seen in the display:
Prompt:
BATT. DISCHARGER IPSDISP Vx.x
Action: Press <ENTER> to proceed or press <SKIP> to halt program execution and return to the monitor program.
Prompt: EXIT PROGRAM?
Action: Press <ENTER> if it is desired that program execution is to be terminated or press <SKIP> to proceed.
Prompt: CAPACITY TEST?
Action: To measure the capacity of the batteries, press <ENTER>. Press <SKIP> if this is not desired.
Prompt: CURR TIME: hhmmss
Action: The current time is displayed in HHMMSS format. If no change in the time is desired just press <ENTER>. Otherwise enter the desired time in HHMMSS format. No mod checks are performed on this newly entered time. Make sure that the unit is on charge. This test will terminate if the 121 is removed from and not placed back on charge within 30 seconds.
Prompt: RCHRG TIME: nnnnn
This prompt will appear only when the capacity test has been selected. The contents of the battery charge timer will be displayed and updated every 5.5 seconds until its value is zero (full charge). The value of the RTC will be read and stored. This test will terminate if the 121 is removed from and not placed back on charge within 30 seconds.
Prompt: DISCHARGING.
This prompt indicates the 121 is currently discharging its batteries. This will continue until LB2 becomes active (batteries discharged). The LOW BATT flag on indicates that the unit is discharging and the blinking SHIFT flag indicates the unit is active. This test will terminate if the 121 is removed from and not placed back on charge within 30 seconds.
Prompt: RECHARGING.
This prompt indicates that the 121 has reached LB2. The value of the RTC is then read and saved. The unit will start to charge its batteries until LB1 becomes inactive (not low battery). The blinking SHIFT flag indicates the unit is active. When LB1 becomes inactive the RTC is then read and saved. This test will terminate if the 121 is removed from and not placed back on charge within 30 seconds.
Prompt: S TIME: hhmmss
Action: The 121 no longer checks if it is on charge. It is the user's responsibility to ensure that the unit remains on charge until the LOW BATT flag is turned off in order for the batteries to fully benefit from this test. The time stored at the beginning of the test is displayed in HHMMSS format. Press <ENTER> to proceed.
Prompt: LB2 TIME: hhmmss
Action: The time where LB2 became active is displayed. Press <ENTER> to proceed.
Prompt: LB1 TIME: hhmmss
Action: The time where LB1 became inactive is displayed. Press <ENTER> to continue.
Prompt: % CAPACITY: nnn
Action: This prompt will appear only if the capacity test was selected. It is a percentage of:
(time taken to discharge the batteries from a full charge)/eight hours.
Press <ENTER> to proceed.

When either the capacity or conditioning tests are executing and the 121 is removed from charge the following message will be displayed.
Prompt: CHARGER!
Action: If the unit is placed back on charge within 30 seconds the test will continue. If it is not an error message will be displayed.
Prompt: TEST ABORTED.
Action: Press <ENTER> to proceed to the 'EXIT PROGRAM?' prompt.

INTRODUCTION TO THE LISTING OF THE SUBROUTINE PSBAT1P

The following listing has the heading: "PSBAT1P: 121 BATTERY DISCHARGE & CYCLE PLN VER 2.8 03/23/84 12:41: 49", and is generally outlined as follows:

0-5 "$ PSBAT1P; 121 BATTERY DISCHARGE AND CYCLE SUBROUTINE PSBAT1P VERSION 0016"

6-28: HISTORY

07/07/83: Under this data a first programmer is shown as author of a program entitled "121 BATTERY DISCHARGE PROGRAM"

07/13/83: "REMOVED THE CODE THAT ALLOWED THE USER TO MODIFY THE BATTERY CHARGE TIMER."

08/01/03: Under this data a second programmer has the note: "PSBAT1P CREATED"

11/21/83: On Nov. 21, 1983, there is a notation by a third programmer "COPY FILE PCURCNP CHANGED, THIS CODE WAS FIXED TO REFLECT THE CHANGES. REMOVED PROGRAM HEADER,"

03/23/84: On Mar. 23, 1984, a fourth programmer makes the following entry into the program history: "MODIFIED SO THAT THE SYSTEM DRIVER IS NOT NEEDED. IT WAS ONLY USED TO DETERMINE WHEN FULL CHARGE WAS ACCOMPLISHED. THIS IS NOW DONE BY DETERMINING IF THE INTERPRETER IS CURRENTLY CHARGING THE BATTERIES. IF NOT, TEST TO SEE IF IT IS BECAUSE THE CHARGE POWER HAS BEEN REMOVED. IF IT HAS NOT, THEN THE PRECHARGE IS COMPLETE. THE DISPLAY OF TIME NOW INCREMENTS BY TENTHS INSTEAD OF DECREMENTS BY MINUTES."

29-33: EXTERNALS—NUMERIC FUNCTION INPUT 34-45: PSBAT1P—PROGRAM CONSTANTS 46-72: PCINCNP—INPUT CONTROL ATTRIBUTES 74-101: PCHRCNP—CHARACTER AND KEY DEFINITIONS 102-152: PCKBCNP—KEYBOARD OPEN MODES, GET AND PUT CONTROL OPTIONS 153-200: PCURCNP—URTIO GET AND PUT CONTROL 207-200: PCKBCMP—REQUIRED IF 'INPUT' FUNCTION AND/OR 'PRINT' SUBROUTINE ARE LINKED WITH APPLICATION 227-249: PCLKFDP—CLOCK FD AND BUFFER 306-341: PROCEDURE—BATT TEST 342-421: PROCEDURE—DEEP DISCHARGE 422-449: PROCEDURE—PLUG IN CHARGER

EXCERPTS OF DETAILED LISTING OF SUBROUTINE PSBAT1P

A copy of the listing (except for locations 1-33 which are adequately indicated in the proceding section) is as follows:

```
  34  0        $ FSBATIP PROGRAM CONSTANTS
  35  0          CONSTANTS
  36  0
  37  0              VER                   = 'V1.5'
  38  0              TRUE                  = 1
  39  0              FALSE                 = 0
  40  0              MINUS_ONE             = 65535
  41  0              SPACE                 = 32
  42  0              UNDERSCORE            = 95
  43  0              HI_VALU               = 255
  44  0              NULL                  = 0
  45  0
  46  0
  47  0        $
  48  0          ;BEGIN COPY LIBRARY -- PCINCNP
  49  0          ;***********************************************************
  50  0          ;***********************************************************
  51  0          ;          'INPUT' CONTROL ATTRIBUTES
  52  0          ;***********************************************************
  53  0          ;***********************************************************
  54  0
  55  0
  56  0              E   = 0      ;ENTER ONLY
  57  0              S   = 1      ;SKIP ALLOWED
  58  0              F   = 2      ;FUNCTION ALLOWED
  59  0              A   = 8      ;AUTO-ENTRY ALLOWED
  60  0              V   = 36     ;VIEW WITHOUT DATA ENTRY
  61  0              VU  = 68     ;VIEW WITH UPDATE AFTER A DELETE
  62  0              VOU = 20     ;VIEW WITH OPTIONAL UPDATE
  63  0              SCR = 128    ;SCROLL
  64  0              T   = 256    ;PROMPT ON THE TOP LINE
  65  0              B   = 512    ;PROMPT ON THE BOTTOM LINE
  66  0              H   = 1024   ;HOME THE CURSOR AND CLEAR DISPLAY
  67  0              L   = 2048   ;ALLOW SEARCH
  68  0              N   = 4112   ;CLEAR INPUT FIELD ON ENTER ONLY
  69  0              TB  = 8192   ;PROMPT ON TOP, INPUT ON BOTTOM
  70  0              RTD = 16384  ;RETURN ON DELETE/CLEAR AND CHRCNT = 0
  71  0              RTF = 32768  ;RETURN ON CONTROL KEY
```

```
 72                      ;END COPY LIBRARY - FCINCNF
 73
 74
 75                      ;BEGIN COPY LIBRARY - FCHRCNF
 76
 77     ;***************************************************
 78     ;
 79     ; CHARACTER AND KEY DEFINITIONS
 80     ;
 81     ;***************************************************
 82
 83          BEL        = CHAR (7)              ;KEEP
 84          BS         = CHAR (8)              ;BACKSPACE
 85          LF         = CHAR (10)
 86          CR         = CHAR (13)
 87          CRLF       = CR & LF
 88          SP         = CHAR (32)             ;SPACE
 89          HT         = CHAR (9)              ;HORIZONTAL TAB
 90
 91          FUNC_KEY   = 6
 92          SKIP_KEY   = 27
 93          ENTER_KEY  = 13
 94          UP_KEY     = 8
 95          DOWN_KEY   = 10
 96          SRCH_KEY   = 12
 97          DEL_KEY    = 127
 98          CLR_KEY    = 21
 99
100                      ;END COPY LIBRARY - FCHRCNF
101
102                      ;BEGIN COPY LIBRARY - FCKBCNF
103
104     ;***************************************************
105     ;
106     ; KEYBOARD OPEN MODES, GET AND PUT CONTROL OPTIONS
107     ;
108     ;***************************************************
109
110
111
```

```
112         KB_NAME         = 'KB010;'
113    ;
114    ; OPEN MODES
115    ;
116         KB_KEY_CLICK    = 1         ;OPEN WITH KEY CLICK ON
117         KB_SHIFT_LOCK   = 2         ;OPEN WITH SHIFT LOCK ON
118         KB_OFF_CURSOR   = 4         ;OPEN WITH CURSOR OFF
119    ;
120    ; GET CONTROL
121    ;
122         KB_CHRCNT       = 1         ;GET NUMBER OF CHARS INPUT
123         KB_KEY          = 2         ;GET LAST KEYPRESS
124         KB_LCD          = 3         ;GET LCD ATTRIBUTES
125    ;
126    ; PUT CONTROL
127    ;
128         KB_PARTIAL      = 768       ;PARTIAL FORMATTING
129         KB_FULL         = 769       ;FULL FORMATTING
130         KB_AUTO         = 770       ;AUTO ENTRY ON
131         KB_NOAUTO       = 771       ;AUTO ENTRY OFF
132         KB_NOENTRY      = 772       ;NO DATA ENTRY REQUIRED
133         KB_ENTRY        = 773       ;DATA ENTRY REQUIRED
134         KB_ABORT        = 774       ;ALLOW CONTROL KEYS TO EXIT INPUT
135         KB_NOABORT      = 775       ;DON'T ALLOW
136         KB_BUZZER       = 1033      ;TURN ON DISPLAY BUZZER
137         KB_OFFBUZZER    = 1034      ;TURN OFF DISPLAY BUZZER
138         KB_CURSOR       = 1280      ;TURN CURSOR ON
139         KB_NOCURSOR     = 1281      ;TURN CURSOR OFF
140         KB_HOME         = 1282
141         KB_CLEOL        = 1283      ;CLEAR TO END OF LINE
142         KB_CLEOP        = 1284      ;CLEAR TO END OF PAGE
143         KB_SWAP         = 1285      ;SWAP KEY TABLES
144         KB_CLICK        = 1286      ;KEY CLICK ON
145         KB_NOCLICK      = 1287      ;KEY CLICK OFF
146         KB_LOCK         = 1288      ;LOCK KEYBOARD
147         KB_UNLOCK       = 1289      ;UNLOCK KEYBOARD
148         KB_BINARY       = 1290      ;SEND BINARY DATA TO PORT
149         KB_WIDTH        = 1291      ;SET CHARACTERS PER ROW
150         KB_LENGTH       = 1292      ;SET NUMBER OF ROWS
151    ;
152    ; END COPY LIBRARY - FCKBCNF
153    ;
154    ; BEGIN COPY LIBRARY - PCURCNF
155    ;
156    ;*********************************************************
157    ;*********************************************************
158    ;   URTIO GET AND PUT CONTROL
159    ;*********************************************************
160    ;*********************************************************
161    ;
```

```
162  0        ;GET CONTROL
163  0
164  0        UR_CHRCHT       = 1          ;CHARACTERS RETURNED BY LAST IN
165  0        UR_KEY          = 2          ;LAST CHARACTER RETURNED
166  0        UR_SIGNALS      = 5          ;EIA/BATTERY SIGNALS
167  0
168  0
169  0        ;PUT CONTROL
170  0
171  0        UR_BAUD         = 2048       ;SET BAUD RATE
172  0        UR_PARITY       = 2050       ;SET PARITY
173  0        UR_DATA         = 2051       ;SET NUMBER OF DATA BITS
174  0        UR_STOP         = 2052       ;SET NUMBER OF STOP BITS
175  0        UR_ROUTE        = 2053       ;SET IO ROUTING
176  0        UR_SET          = 2054       ;ACTIVATE THE IO PINS
177  0        UR_RESET        = 2055       ;DEACTIVATE
178  0        UR_TIME1        = 2060       ;1ST CHARACTER WAIT TIME
179  0        UR_TIME2        = 2061       ;INTERCHARACTER WAIT
180  0
181  0        ;PINS
182  0
183  0        UR_DTR          = 1
184  0        UR_RTS          = 2
185  0        UR_RCT          = 4
186  0        UR_TXD          = 8
187  0        UR_SCAN         = 16
188  0        UR_BACKUP       = 32         ;BACKUP BATTERY
189  0        UR_CHRG_CNTL    = 64         ;TRICKLE = 0, FULL = 1
190  0        UR_DISCHARGE    = 128        ;DISABLED = 0 (LB1), ENABLED = 1 (LB2)
191  0        UR_DSR          = 256
192  0        UR_CTS          = 512
193  0        UR_RCR          = 1024
194  0        UR_RXD          = 2048
195  0        UR_PROXIMITY    = 4096
196  0        UR_CROSSOVER    = 8192
197  0        UR_LOWBATT      = 16384      ;LB1/LB2
198  0        UR_CHARGE       = 32768      ;CHARGER PLUGGED IN = 1
199  0
200  0        ;END OF COPY LIBRARY - PCURCNP
201  0              CHARGE_CNTL            = 64    ;FAST/TRICKLE CHARGE
202  0              DISCHARGE              = 128   ;DEEP DISCHARGE
203  0        $ PSBATIP PROGRAM FD'S AND BUFFERS
204  0
205  0        COMMON VARIABLES
206  0
207  0        ;BEGIN COPY LIBRARY - PCKBCMP
208  0
```

```
209  0   ;***********************************************************************
210  0   ; FIXED COMMON AREA
211  0   ;
212  0   ;   REQUIRED IF 'INPUT' FUNCTION AND/OR 'PRINT' SUBROUTINE ARE
213  0   ;     LINKED WITH APPLICATION
214  0   ;
215  0   ;***********************************************************************
216  0
217  0   FD    KBD
218  0   01 KEY       BINARY BYTE   ;HOLDS MOST RECENT KEYPRESS
219  0   01 CHRCNT    BINARY BYTE   ;HOLDS NUMBER OF CHARS INPUT
220  0   FD    PRT (56)              ;53 CHARS + 3 FOR NEW PROTOCOL SUPPORT
221  0   FD    PRT                   ;OLD PROTOCOL
222  0
223  0   ;END COPY LIBRARY - PCKBCMP
224  0
225  0   ;BEGIN COPY LIBRARY - PCLKFDP
226  0
227  0   ;***********************************************************************
228  0   ;
229  0   ; CLOCK FD AND BUFFER
230  0   ;
231  0   ;***********************************************************************
232  0   FD    CLK
233  0   01 CLKBUF
234  0      05 TIME
235  0         10 HOURS                    PIC 99
236  0         10 MINS                     PIC 99
237  0         10 SECS                     PIC 99
238  0      05 SHOW_TIME REDEFINES TIME    PIC X(6)
239  0      05 DATE
240  0         10 YEAR                     PIC 99
241  0         10 MONTH                    PIC 99
242  0         10 DAY                      PIC 99
243  0      05 SHOW_DATE REDEFINES DATE    PIC X(6)
244  0      05 DAY_OF_WEEK                 PIC 9       ;SUNDAY = ONE
245  0
246  0   ;END COPY LIBRARY - PCLKFDP
247  0   01 ASGNCLK REDEFINES CLKBUF       PIC 9(6)
248  0
249  0   LOCAL VARIABLES
250 -0
251  0   FD    URT
252  0   FD    SYS
253  0
254  0   01 KBD_BUFFER                     PIC X(32)
```

```
258      01  KBD_SAVE                              PIC X(32)
259  $ PSBATIF PROGRAM VARIABLES
260
261      01  PROG_VARIABLES
262          05  RESPONSE                          PIC 9
263          05  DSP_SIZE                          BINARY BYTE
264          05  KK                                BINARY BYTE
265          05  M                                 BINARY WORD
266          05  BATT_PERCENT                      PIC ZZ9
267          05  STRT_TIME                         PIC 9(6)
268          05  KSTRT_TIME REDEFINES STRT_TIME
269              10  HRS                           PIC 99
270              10  MINS                          PIC 99
271              10  SECS                          PIC 99
272          05  LOW_TIME                          PIC 9(6)
273          05  KLOW_TIME REDEFINES LOW_TIME
274              10  HRS                           PIC 99
275              10  MINS                          PIC 99
276              10  SECS                          PIC 99
277          05  END_TIME                          PIC 9(6)
278          05  CURR_EIA                          BINARY WORD
279          05  SAVE_EIA                          BINARY WORD
280          05  KSAVE_EIA REDEFINES SAVE_EIA
281              10  SAVE_HIGH                     BINARY BYTE
282              10  SAVE_LOW                      BINARY BYTE
283          05  BATT_TIME                         PIC ZZNUN
284          05  DEBOUNCE_CHARGER                  BINARY BYTE
285  $ PSBATIF PROGRAM MASTER_CONTROL
286  ; OPEN DRIVERS, FILES AND INIT ERROR PROCEDURES
287
288      PROCEDURE INIT
289          ;OPEN(KBD,KBD_BUFFER)'KBDIO;',KB_KEY_CLICK + KB_OFF_CURSOR
290                                                              ;OPEN DRIVERS CURSOR OFF
291          ;GETCTL(KBD) DSP_SIZE, KB_LCD                        ;LED OR LCD DISPLAY?
292          ;PUTCTL(KBD) 16, KB_WIDTH,      DSP_SIZE/16, KB_LENGTH ;LINE_LENGTH 16 CHAR ROW
293          OPEN(CLK,CLKBUF)'CLKIO;'
294          OPEN(URT)'URTIO;'
295
```

```
296   12            PERFORM MASTER_CONTROL.
297   14        END; END INIT
298   15    $
299   15    ;   PROCEDURE MASTER_CONTROL.
300   15    ;
301   15        WHILE (INPUT(H+S,'BATTERY TEST?')) DO
302   24            PERFORM BATT_TST
303   26        ENDWHILE
304   28        STOP
305   28    ;
306   29    ;   END; END MASTER_CONTROL.
307   29    $
308   29    ;   PROCEDURE BATT_TST
309   29    ;
310   29    ;   THIS PROCEDURE ALLOWS THE USER TO SELECT THE BATTERY
311   29    ;   CAPACITY TEST OR NOT.  IF THE CAPACITY TEST IS CHOSEN
312   29    ;   THIS PROCEDURE WILL WAIT UNTIL THE BATTERY CHARGE
313   29    ;   TIMER HAS REACHED FULL CHARGE (DECREMENTED TO ZERO
314   29    ;   FROM 780 MINUTES) BEFORE DISCHARGING IS INITIATED.
315   29    ;
316   36        M := INPUT(H+S,'CAPACITY TEST?')
317   40        GET(CLK)
318   50        RESPONSE = INPUT(JDQ+H,'CURR TIME?',ASGNCLK)    ;READ START TIME
319   55    ;*  IF CHKCNT <> 0 THEN PUT(CLK)
320   55    ;*
321   55    ;*  CHARGE TILL BATTERY TIMER = 0 FOR CAPACITY TEST.
322   55        IF M THEN
323   58            DEBOUNCE_CHARGER = 10
324   62            REPEAT
325   62                GETCTL(URT) CURR_ETA, UR_SIGNALS
326   66                IF (CURR_ETA AND CHARGE_CNTL) THEN
327   72                    OUT(NRD)(KB_HOME)'RCHRG TIME?',BATT_TIME
328   81                    WAIT 60                              ;WAIT FOR TIMER
329   84                    BATT_TIME = BATT_TIME + 0.1
330   90                    DEBOUNCE_CHARGER = 10
331   94                ELSEIF NOT(CURR_ETA AND UR_CHARGE) THEN
332  103                    PERFORM PLUG_IN_CHARGER
333  105                ELSE
```

```
334  107            DEBOUNCE_CHARGER = DEBOUNCE_CHARGER - 1
335  112          ENDIF
336  112       UNTIL DEBOUNCE_CHARGER = 0
337  116    ENDIF
338  116    GETCTL(URT) SAVE_EIA, UR_SIGNALS
339  120    IF NOT(SAVE_EIA AND UR_CHARGE) THEN PERFORM PLUG_IN_CHARGER
340  129    PERFORM DEEP_DISCHARGE
341  131  END;
342  132  $
343  132  PROCEDURE DEEP_DISCHARGE
344  132  ;
345  132  ;   M IS AN INPUT FLAG THAT INDICATES CAPACITY TEST OR NOT.
346  132  ;   THIS PROCEDURE WILL DISCHARGE TILL LB2 (DISCHARGED),
347  132  ;   THEN RECHARGE TILL NOT LB1 (NOT LOW BATTERY).
348  132  ;   TOGGLE THE SHIFT FLAG TO SHOW ACTIVITY.
349  132  ;
350  132  ;   ALLOW THE INTERPRETER TIME TO DO ITS THING.
351  132  ;   IPMONA WILL SET CHARGE_CNTL (FAST CHARGE) WHEN LB2 IS REACHED.
352  132  ;
353  132  ;   WHEN NOT LB1 IS REACHED DISPLAY THE START TIME,
354  132  ;   LB2 TIME, AND NOT LB1 TIME.  IF THE CAPACITY TEST WAS
355  132  ;   CHOSEN THE BATTERY CAPACITY WILL THEN BE CALCULATED
356  132  ;   ON AN 8 HOUR BASE AND THEN DISPLAYED TO THE USER.
357  132  ;   BATTERY CAPACITY WILL NOT EXCEED 100 PERCENT.
358  132  ;
359  132  GET(CLK)
360  134  STRT_TIME = ASGNCLK            ;READ STARTING TIME
361  137  ;*
362  137  ;* TURN ON DISCHARGE, TURN OFF FAST CHARGE FOR MAINS & BACKUP,
363  137  ;*
364  137  &  PUTCTL(URT) DISCHARGE, UR_SET,
365  147          UR_BACKUP+CHARGE_CNTL, UR_RESET ,TURN ON DISCHARGE
366  154    OUT(KBD)(KB_HOME)'DISCHARGING.'
367  154    REPEAT
368  157       WAIT 55
369  161       PUTCTL(KBD) KB_LOCK
370  165       GETCTL(URT) CURR_EIA, UR_SIGNALS
371  172       IF NOT (CURR_EIA AND UR_CHARGE) THEN
372  174  ;*        PERFORM PLUG_IN_CHARGER
373  174  ;*
374  174  ;* RECOVER FROM IPMONA AFTER TAKEN OFF WALL CHARGER
375  174  ;*
376  174  &       PUTCTL(URT) DISCHARGE, UR_SET,
377  174               UR_BACKUP+CHARGE_CNTL, UR_RESET
378  184          GETCTL(URT) CURR_EIA, UR_SIGNALS
379  188       ENDIF
380  188       WAIT 10
```

```
381  191        PUTCTL(KBD) KB_UNLOCK
382  195        UNTIL ((CURR_EIA AND UR_LOWBATT) OR (CURR_EIA AND CHARGE_CNTL)
383  206 ;*
384  206 ;*     LB2 REACHED (BATTERIES DISCHARGED)
385  206 ;*
386  206        GET(CLK)                                    ;READ LB2 TIME
387  208        LOW_TIME = ASGNCLK
388  211 ;*
389  211 ;*     TURN OFF DISCHARGE, TURN ON FAST CHARGE FOR MAINS & BACKUP.
390  211 ;*
391  211        PUTCTL(UR1) DISCHARGE, UR_RESET,
392  211 &                  UR_BACKUP+CHARGE_CNTL, UR_SET
393  221        OUT(KBD)<KB_HOME>'RECHARGING,'
394  226        REPEAT
395  228        WAIT 55
396  231        PUTCTL(KBD) KB_LOCK
397  235            GETCTL(UR1) CURR_EIA,UR_SIGNALS
398  235            IF NOT(CURR_EIA AND UR_CHARGE) THEN PERFORM PLUG_IN_CHARGER
399  243            WAIT 10
400  251        PUTCTL(KBD) KB_UNLOCK
401  255        UNTIL ( NOT ((CURR_EIA AND UR_LOWBATT))
402  262 ;*
403  262 ;*     NOT LB1 REACHED (BATTERIES OUT OF LOW BATT)
404  262 ;*
405  262        GET(CLK)                                    ;READ NOT LB1 TIME
406  264        END_TIME = ASGNCLK
407  267        RESPONSE = INPUT(H+V,'S TIME?',STRT_TIME)
408  267 &                 INPUT(V,'LB2 TIME?',LOW_TIME)
409  267 &                 INPUT(V,'LB1 TIME?',END_TIME)
410  295        IF M THEN                                   ;WAS THIS CAPACITY TEST?
411  298            IF RSTRT_TIME.HRS > RLOW_TIME.HRS THEN
412  298                RLOW_TIME.HRS = RLOW_TIME.HRS + 24
413  309            BATT_PERCENT = (((RLOW_TIME.HRS * 3600) + (RLOW_TIME.MINS * 60)
414  309 &                         + RLOW_TIME.SECS) - ((RSTRT_TIME.HRS * 3600)
415  309 &                         + (RSTRT_TIME.HRS * 60) + RSTRT_TIME.SECS))
416  309 &                         / 288          ;288 = 100/(8HRS * 3600)
417  337            IF BATT_PERCENT > 100 THEN
418  337                BATT_PERCENT = 100
419  347            RESPONSE = INPUT(H+V,'% CAPACITY?',BATT_PERCENT)
420  357        ENDIF
421  357        END;
```

```
422  350    $  PROCEDURE PLUG_IN_CHARGER
423  350    ,
424  350    ,     THIS PROC IS EXECUTED WHEN THE TERMINAL IS TAKEN OFF
425  350    ,     CHARGE WHILE IT IS TRYING TO CHARGE/DISCHARGE.
426  350    ,     AN ERROR MESSAGE IS DISPLAYED AND THE USER HAS 30 SECONDS
427  350    ,     TO PLACE THE UNIT BACK ON CHARGE UNTIL THE TEST IS ABORTED.
428  350    ,
429  350    ;
430  350          KBD_SAVE = KBD_BUFFER                    ;SAVE DISPLAY
431  361          KK = 5                                   ;GIVE 30 SECONDS TILL ABORT
432  364          REPEAT
433  364            OUT(KBD)(KB_HOME)'CHARGER ',BEL
434  374            WAIT 60                                ;GIVE TIME TO UPDATE DISPLAY
435  377            KK = KK - 1
436  382            GETCTL(URT) CURR_EIA, UR_SIGNALS
437  386          UNTIL ((KK = 0) OR (CURR_EIA AND UR_CHARGE))
438  395          IF KK = 0 THEN
439  399            PUTCTL(URT) SAVE_LOW, UR_SET,
440  399      &        UR_DIR+UR_RTS+UR_RCT+UR_TXD+UR_SCAN+DISCHARGE+
441  399      &        UR_BACKUP+CHARGE_CNTL, UR_RESET
442  408            PUTCTL(KBD) KB_UNLOCK                   ;RESTORE ORIGINALS
443  408            PUTCTL(KBD) KB_UNLOCK
444  412            RESPONSE = INPUT(E,'TEST ABORTED.' & BEL)
445  423            RETURN MASTER_CONTROL
446  426          ENDIF
447  426          KBD_BUFFER = KBD_SAVE                    ;RESTORE BUFFER
448  429          PUT(KBD)                                 ;REDISPLAY
449  431          END;
450  432
451  432
452  432  END INIT;   END OF PROGRAM PSBATIP

0    ERROR DIAGNOSTICS IN PSBATIP      (  0 ERROR,   0 WARNING )
     432    BYTES OF MODULE CODE STORAGE,     147 BYTES OF DATA STORAGE
      10    LITERALS GENERATED IN MODULE,     203 BYTES OF DATA AND POINTERS
      25    VARIABLES ACCESSED IN MODULE,     125 BYTES OF FIELD DEFINITIONS
     805    TOTAL BYTES IN OBJECT FILE
    2936    WORDS OF COMPILER SPACE USED,   20000 WORDS AVAILABLE FOR ALLOCATION
```

DESCRIPTION OF FUNCTIONS AND FEATURES OF AN EMBODIMENT SUCH AS SHOWN IN FIGS. 12-14

At the time of development of the circuit of FIG. 13, a preliminary summary of available functions and features of the system of FIGS. 12 and 13 was prepared. A copy of excerpts from an edited version of this summary, directed to the commercial Model 121 data terminal unit utilizing the circuit of FIG. 13, is found hereafter.

PRELIMINARY SUMMARY OF PRESENT FUNCTIONS AND FEATURES OF THE 121, SEMI-INTELLIGENT BATTERY CONTROLLER

The 121 Battery Controller coupled with existing real time clock and NSC-800 CPU integrates a maximum number of features with minimum circuit duplication for an extremely versatile yet low cost solution.

The controller is designed to match the NICAD-Battery characteristics with the 121 requirements and is software and user adjustable to match the customers changing needs.

The most outstanding features of this 121 battery controller combination are as follows:

**Conditioning Charge
  The periodic use of this feature virtually eliminates the memory effect of voltage depression and extends normal battery service life @ 1 year. This is accomplished by a controlled deep discharge of both the main batteries and backups. Followed by a normal recharge for 12 hours then automatically switch to stand by charge.

**Capacity Test
  The capacity of main and backup batteries can be measured to precisely indicate battery condition and determine when a conditioning charge is necessary or when batteries should be replaced. This is done by a full recharge (12 hours) followed by a controlled timed constant current deep discharge at a C/5 rate, where the capacity is measured by the NSC-800 processor and is displayed as % of full capacity available, followed by a regular charge.

*Charge Efficiency Test
  Can be used to find optimum charge rate, charge time, or an indicator of poor battery performance. This test is performed by deep discharging the batteries followed by a timed constant current charge and a timed constant discharge, then the CPU calculates charge efficiency. A normal recharge cycle follows.

*Normal Recharge
  A complete recharge is accomplished in 12 hours. At a constant current rate at C/8,3, recharge is controlled by the CPU and initiated by plugging unit into charger.

**Over-Charge Protection
  This feature prevents over-charge if unit is continually plugged in and out from a charger such as in *route accounting*. In addition, when the unit is unplugged from a charger, the CPU will increment an elapsed time counter by a constant of two minutes for every minute off charge, until a maximum of 12 hours has been incremented, (six hours of real time). When returned to charger the CPU will decrement from the incremented amount to determine charge time. Maximum charge time of 12 hours is set whenever the unit has been turned off.

*Fuel Gauge Feature
  From a full charge, (when the charge counter is at 0), the 121 can calculate operating time remaining. This is done by incrementing a counter by a constant for operating time and a constant for standby time to find the amp-hour drained from a fully charged battery pack.

*Variable Recharge Rate
  A wide range of charge rates and times are under CPU control. Fast charge models could be made available with a resistor charge and appropriate software.

**Standby Holding Charge
  This feature keeps the batteries at full charge ready for use by charging them at a C/100 rate. Control by the CPU.

**Charge Indicator
  A positive indication of unit being plugged into charge is displayed regardless of on/off switch. Controlled by CPU.

*Remote control and diagnostics can be performed or telecom of battery parameters.
  Battery testing and conditioning can be performed without an onsite inspection.

*Self Diagnostic Battery Testing Capability
  Production—During manufacturing, units can be programmed to cycle batteries several times and measure their capacity to identify defective units before they leave the plant.
  Field Test—Battery condition can be easily checked by Field Service.
  User Test—The customer can check the condition of his batteries.

**Temperature Protection Over-Under
  Over and under temperature protection is an integral part of the battery pack reducing possible abuse and promoting longer battery life. Units will taper back charge rate at low temperature below 10° C. and cut back to trickle rates at high battery temperature above 55° C.

**Low Battery Indicator
  Tells user when batteries must be recharged to prevent loss of memory data, giving the user a minimum of 30 minutes standby operation until recharge.

**Deep Discharge Indicator
  During a discharge the controller tells CPU when batteries are completely discharged.

*All functions and features excluding (internal) temperature protection are under software control and thus can be modified for optimum performance throughout life.

**Battery pack hardware can accommodate ½D cells with only resistor changes from the 3/5C pack.

**The software and functions are the same with ½D or 3/5C cells so as to allow the changing of different packs if desired at a later date without changes internal to the 121 hardware or software.

**The present 121 design with the semi-intelligent battery controller remains hardware compatible with the "smart" battery pack.

*May be included for further reliability and functionality.
**Required features for reliable operation in all applications.

Beyond this, the complete cost of all parts of the customer replaceable 121 semi-intelligent battery controller is less than $27 including four 3/5C cells. This is based on 100p quantities. Production quantities would represent a parts cost reduction.

DEFINITION OF 121 BATTERY PACK CONTROL LINES

Charge Control (P 3-5)
CHARGECONTROL, Standby charge Rate c/100
CHARGE CONTROL, Full charge Rate C/8.3
Discharge (P 3-4)
DISCHARGE, Discharge is disabled LB1 is activated
DISCHARGE, Discharge is enabled at a −c/5 rate LB2 is now active
LB1/LB2 (P 3-1)
LB1 is the low battery detect of 4.65 volts and is reset high at 5.4 V.
$\overline{LB1}$, indicates low battery
LB1, not low battery
LB2 is the discharged detect of 3.8 volts and is reset high at 5.4 V.
$\overline{LB2}$, indicates main and backups are completely discharged
LB2, not discharged
+BATT (P 3-2)
Normally +5 volts from 4 cell battery
−BATT (P 3-6)
Ground line
CHARGE
Is a constant current charge limited to 0.66 amp on the CPU board.

121 SEMI-INTELLIGENT BATTERY CONTROLLER

Operational Sequence of Required Features

CHARGE COUNTER

Is a software function to simplify battery pack operational description.
(1) Charge counter enables the charge control
   Charge counter >0, charge control high
   Charge counter=0, charge control low
(2) Counter is decremented by real time to zero when charge control is high.
(3) Counter is incremented by two times real time up to a maximum of 12 hours whenever unit is taken off charge while turned on.
(4) If the unit is turned off and not plugged in to charge, then on power up, counter will set to 12 hours.
(5) Counter is set to 12 hours when LB1 or LB2 is present.
(6) Discharge sets counter to zero.

NORMAL RECHARGE/OVER CHARGE PROTECTED
(1) When unit is plugged into charger and charge counter is zero.
(2) Charge control will always be low if not plugged in to charge.

STAND-BY CHARGE
(1) When unit is plugged into charger and charge counter is zero.

LOW BATT (DISPLAY)
(1) Will be displayed during $\overline{LB1}$ or $\overline{LB2}$ BATT RECHARGING (DISPLAY)
(1) When plugged into charge it will always be enabled in one of two modes.
   (A) Will be on steady when charge counter is zero, signifying a full charge or that a user selectable function is complete.
   (B) Will blink on and off when charge counter is not zero or user selectable function is in progress.

CHARGING FUNCTION AND STATUS (DISPLAY)

When unit is turned off or on and plugged into charger if possible
(1) Indicate if a user selectable function is in progress and the time remaining to end of function.
(2) During normal recharge display the charge counter time such as
   TIME TO FULL RECHARGE XX:XX
   ζand
   FULL RECHARGE READY
*CONDITIONING CHARGE
(1) Key in "CONDITIONING CHARGE"
(2) Discharge until $\overline{LB2}$
(3) Display "CONDITIONING COMPLETE"
*CAPACITY TEST
(1) Key in "CAPACITY TEST"
(2) Charge until charge counter is zero
(3) Discharge until $\overline{LB2}$
(4) Discharge time/s is the percent of full rated capacity
(5) Display "XXX % CAPACITY AVAILABLE"
*USER SELECTABLE BATTERY FUNCTIONS: These functions can only be started and performed while charger is plugged in with unit turned on. If charger is unplugged before function is complete, then cancel and display "TEST INVALID".

DESCRIPTION OF AN EMBODIMENT CORRESPONDING TO FIGS. 12-14 FOR CONDITIONING SPARE BATTERY PACKS

As previously explained the embodiment of FIGS. 12, 13 and 14 can represent a stationary battery conditioning system for example for conditioning nickel cadmium battery packs of the Model 121 portable data terminal unit as described herein.

The following shows a copy of a preliminary summary of recommendations for a charger system to be used with spare battery packs for the Model 121.

The "smart" battery pack is shown by FIGS. 2, 3, 4, 5, 9A, 9B, 10 and 11 herein.

This report contains a preliminary summary of recommendations for a dual charger system to be used with spare NT121 battery packs.

Its intended use is to charge spare NT121 battery packs consistent with all functions and features of the NT121 controller combination to ensure equivalent life and reliability is achieved.

The applicable functions of the 121 battery charger are as follows:
Conditioning Charge
Capacity Test
Normal recharge
Over-charge Protection
Variable Recharge Rate
Standby Charge
Charge Indicator
Low Battery Indicator
Deep Discharge Indicator
Software Control
Hardware Control
Hardware Compatible with Smart Battery Pack
Conditioning Charge:

The periodic use of this feature virtually eliminates the memory effect of voltage depression and extends normal battery service life to one year. This is accomplished by a controlled deep discharge of both the main batteries and backups. This is followed by a normal recharge for 12 hours, then automatically switched to standby charge.

Capacity Test:

The capacity of the battery pack can be mseasured precisely to indicate battery condition and can determine when batteries shoucl be replaced. This is done by a full recharge (12 hours) followed by a constant current deep discharge at a C/B rate where the capacity is measured and displayed as percent of full capacity or absolute capacity in amp hours. This is followed by a regular charge.

Normal Recharge:

A complete recharge is accomplished in 12 hours at a constant current rate of C/8.3. Recharge is controlled by the CPU and initiated by the charge counter or the user.

Over-Charge Protection:

This feature prevents over-charge and keeps the battery at a full charge. When the unit is unplugged from a power source, the CPU will increment an elapsed time counter by a constant of one minute for every 20 minutes off charge. Until a maximum of 12 hours has been reached (10 days of real time) when returned to a charge, the CPU will decrement from the incremented time to determine charge time. Maximum charge time of 12 hours is set whenever the batteries are removed from the holder.

Variable Recharge Rate:

A wide range of charge rates and times are under CPU control. Fast charge models could be made available with a resistor charge and appropriate software.

Stand-by Holding Charge:

This feature keeps the batteries at full charge ready for use by charging them at a C/100 rate. Control by the CPU.

Charge Indicator:

A positive indication of unit being plugged into charge is displayed regardless of on/off switch. Controlled by CPU.

Full Charge Indication:

To indicate to the user that the battery pack is fully charged and ready for use.

Low Battery Indicator:

Indicates a dead battery. May not be required.

Deep Discharge Indication:

Indicates a deep discharge is complete. May not be required.

Software Control:

For ease of future modification if required.

Hardware Campatible with the "smart" battery pack.

It will be apparent that many modifications and variations may be made without departing from the scope of the teachings and concepts of the present invention.

What is claimed is:

1. In a portable battery powered system,
a portable battery powered utilization device for operating from battery power during portable operation thereof,
battery means operatively coupled with said utilization device for supplying operating power thereto, and
battery conditioning system means operatively coupled with said battery means and comprising battery conditioning means for controlling conditioning of said battery means, and battery parameter sensing means for sensing battery parameters,
said utilization device together with said battery means and said battery conditioning system means having a size and weight to be carried by an individual person, and
said battery conditioning system means including operating means operatively coupled with said battery conditioning means and controlling conditioning of said battery means in conjunction with said battery parameter sensing means.

2. A portable battery powered system according to claim 1, with
said utilization device having battery receiving means for removably receiving said battery means and having charging voltage receiving means coupled with said battery conditioning means for supplying a charging voltage to said battery means under the control of said battery parameter sensing means.

3. A portable battery powered system according to claim 1, with
said utilization device having a housing, and said battery conditioning system means being contained in said housing as an integral part of said utilization device during portable operation thereof.

4. A portable battery powered system in accordance with claim 1, with
said operating means comprising data processing mseans operatively coupled with said battery means for operation from battery power.

5. A portable battery powered system in accordance with claim 4, with
said battery conditioning system means including display means operatively coupled with said data processing means and providing for the display of data messages pertaining to the condition of said battery means.

6. A portable battery powered system according to claim 1, with
said operating means comprising data processing means operatively coupled with said battery means for operation from battery power,
said data processing means requiring a minimum battery voltage value from said battery means,
said utilization device having battery receiving means for removably receiving said battery means and having charging voltage receiving means coupled with said battery conditioning means for supplying a charging voltage to said battery means under the control of said battery parameter sensing means then, and
said charging voltage receiving means supplying operating voltage to said data processing means during a discharge of said battery means to a battery voltage substantially less than said minimum battery voltage value under the control of said battery conditioning means.

7. A portable battery powered system according to claim 1, with
said operating means including memory means electrically powered by said battery means during portable operation of said battery means, and said memory means being operable for storing data based on a deep discharge conditioning of said battery means under the control of said battery conditioning means.

8. A portable battery powered system according to claim 1, with
said battery conditioning means comprising battery charge flow control means operatively coupled with said battery means for controlling the charge flow from the battery means during a conditioning operation, said operating means including memory means for storing battery operation data and said operating means being operatively coupled with said battery means for storing data in said memory means representative of the use of said battery means during portable operation.

9. A portable battery powered system according to claim 1, with said battery conditioning means further comprising charging control means operatively coupled with said battery means for controlling the rate of charging of said battery means.

10. A portable battery powered system according to claim 9, with said charging control means being controllable by said operating means to effect charging of said battery means at selectable different rates.

11. A portable battery powered system according to claim 1, with said battery conditioning system means having a battery charging voltage input forming part of a battery charging current path for said battery means, charging current regulating means operatively coupled with said batttery charging voltage input and operative to control the magnitude of the charging current supplied to said battery means via said battery charging current path, and said charging current regulating means having a control input for receiving a charging level control signal and being operative to control the charging current supplied to said battery means in accordance with said charging level control signal.

12. A portable battery powered system according to claim 1, with said battery parameter sensing means comprising battery voltage sensing means operatively coupled with said battery means for sensing battery voltage during a battery conditioning operation.

13. A portable battery powered system according to claim 1, with said battery parameter sensing means comprising battery temperature sensing means operatively coupled with said battery means for sensing the temperature of the battery means during a battery conditioning operation.

14. A portable battery powered system according to claim 1, with said battery conditioning means comprising battery discharge mode control means operatively coupled with said battery means for controlling discharge of the battery means prior to recharge thereof, for the purpose of conditioning of the battery means and prolonging its useful life.

15. A portable battery powered system according to claim 14, with said battery discharge mode control means comprising discharge current control means operatively coupled with said battery means and providing a battery current discharge path capable of discharging the battery means down to a deep discharge level during a deep discharge cycle having a time duration of not more than ten hours.

16. In a battery conditioning system, rechargeable battery receiving means for receiving a rechargeable battery means for conditioning, battery conditioning system means coupled with said battery receiving means for effecting deep discharge and recharging cycles of a battery means received thereby, said battery conditioning system means comprising battery discharge means for effecting a deep discharge cycle of the battery means and including battery condition sensing means for sensing a battery discharge condition, and comprising memory means operatively coupled with said battery condition sensing means and operative for storing data based on a deep discharge cycle of a battery means so as to provide a measure of its capacity.

17. A battery conditioning system according to claim 16, with said battery conditioning sensing means comprising battery voltage sensing means operatively coupled with said battery receiving means and operative to sense the output voltage of a battery means during a deep discharge cycle.

18. A battery conditioning system according to claim 16, with said battery conditioning system means comprising a microprocessor operatively coupled with said battery condition sensing means and operable for controlling said memory means to effect the storage therein of said data based on a deep discharge cycle of a battery means.

19. In a battery conditioning system, battery receiving means for operative coupling with a portable battery pack of a size and weight such as to be operatively coupled to and carried with a portable battery powered device by an individual person, during a conditioning operation, and battery conditioning system means operatively coupled with said battery receiving means and operative for automatically effecting a deep discharge and a recharging of a battery pack coupled with said receiving means.

20. A battery conditioning system in accordance with claim 19, with said battery conditioning system means comprising programmed processor means for effecting a deep discharge cycle of said battery pack as a measure of battery capacity.

21. A battery conditioning system in accordance with claim 19, with said battery conditioning system means being operative to sense battery parameters during a battery charging operation.

22. A battery conditioning system in accordance with claim 19, with said battery conditioning system means comprising digital processor means and memory means controlled by said processor means for obtaining a measure of battery capacity during a deep discharge cycle of a battery pack received by said receiving means.

23. In a battery conditioning system, battery receiving means for operative coupling with a battery means comprising a rechargeable electrochemical energy storage medium having an output voltage which is a function not only of the energy stored thereby but also of the number of shallow energy discharge cycles which have occurred after its last deep discharge cycle, battery conditioning system means operatively coupled with said battery receiving means and automatically operable for effecting a deep discharge cycle wherein the battery output voltage is reduced to a value below its minimum operating voltage for reliable operation.

24. A battery conditioning system in accordance with claim 23, with said battery conditioning system means comprising digital processor means operatively coupled with said battery receiving means for sensing when the battery output voltage is reduced to a value below said minimum operating voltage so as to terminate the deep discharge cycle.

25. A battery conditioning system in accordance with claim 24, with said digital processor means having display means for displaying a measure of battery capacity based on a deep discharge cycle of a battery means received by said receiving means.

26. A battery conditioning system according to claim 23, with said battery conditioning system means comprising battery discharge circuit means operatively coupled with said battery receiving means and controllable to effect a deep discharge cycle of a battery means such that the output voltage of the battery means falls below said minimum operating voltage.

27. A battery conditioning system according to claim 26, with said battery conditioning system means comprising automatic discharge energy determining means operatively coupled with said battery receiving means for determining a measure of the amount of energy supplied by a battery means during a deep discharge cycle as a measure of the condition of the battery means.

28. A battery conditioning system in accordance with claim 27, with said battery conditioning system means further comprising memory means operatively coupled with said discharge energy determining means to store a battery capacity indication based on the amount of energy supplied by a battery means during a deep discharge cycle.

29. In a battery conditioning system, a portable battery powered utilization device for operating from battery power during portable operation thereof, battery means operatively coupled with said utilization device for supplying operating power thereto, and battery conditioning system means operatively coupled with said battery means for effecting deep discharge and recharging cycles thereof, said battery conditioning system means comprising battery condition sensing means for sensing a battery discharge condition and comprising memory means operatively coupled with said battery condition sensing means and operative for storing data based on a deep discharge cycle so as to provide a measure of battery capacity.

30. A battery conditioning system according to claim 29, with said battery discharge condition sensing means comprising battery voltage sensing means coupled with said battery means, and said battery conditioning system means being coupled with said battery voltage sensing means for terminating a deep discharge cycle when the battery voltage is reduced to a predetermined value.

* * * * *